(12) United States Patent
Van De Molengraaf et al.

(10) Patent No.: US 11,322,677 B2
(45) Date of Patent: May 3, 2022

(54) ACTUATOR DEVICE BASED ON AN ELECTROACTIVE POLYMER

(71) Applicant: KONINKLIJKE PHILIPS N.V., Eindhoven (NL)

(72) Inventors: Roland Alexander Van De Molengraaf, Geldrop (NL); Mark Thomas Johnson, Arendonk (BE); Cornelis Petrus Hendriks, Eindhoven (NL); Daan Anton Van Den Ende, Breda (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 768 days.

(21) Appl. No.: 16/099,207

(22) PCT Filed: May 15, 2017

(86) PCT No.: PCT/EP2017/061576
§ 371 (c)(1),
(2) Date: Nov. 6, 2018

(87) PCT Pub. No.: WO2017/198597
PCT Pub. Date: Nov. 23, 2017

(65) Prior Publication Data
US 2019/0214545 A1    Jul. 11, 2019

(30) Foreign Application Priority Data

May 18, 2016 (EP) ..................... 16170172

(51) Int. Cl.
*H01L 41/04* (2006.01)
*H01L 41/09* (2006.01)
(Continued)

(52) U.S. Cl.
CPC .......... *H01L 41/193* (2013.01); *H01L 41/042* (2013.01); *H01L 41/0472* (2013.01); *H01L 41/09* (2013.01); *H02N 2/062* (2013.01)

(58) Field of Classification Search
CPC . H01L 41/193; H01L 41/042; H01L 41/0472; H01L 41/09
See application file for complete search history.

(56) References Cited

U.S. PATENT DOCUMENTS 6,876,135 B2    4/2005 Pelrine et al.
8,534,802 B2    9/2013 Miyazawa et al.
(Continued)

FOREIGN PATENT DOCUMENTS

JP    2010-098292 A    4/2010
JP    2015-176915 A    10/2015
(Continued)

*Primary Examiner* — Derek J Rosenau
(74) *Attorney, Agent, or Firm* — Schott, P.C.

(57) ABSTRACT

The invention involves providing a reset signal before and or after one or more actuation signals to an electroactive polymer structure of an actuator. The reset signal can cause relaxation of defects such as e.g. trapped charge, dipoles and/or others in the EAP or EAP structure so that upon a subsequent activation using a drive signal, the initial actuation state is defined to be more constant than without use of the reset signal. Hence the actuation 5 output of a device employing the invention is more reproducible. The invention is applicable to actuator devices that have an electroactive polymer structure including an EAP material, where the structure is capable of providing a mechanical actuation upon subjection of at least part of the EAP material to an electrical drive signal.

20 Claims, 12 Drawing Sheets

(51) Int. Cl.
*H01L 41/193* (2006.01)
*H02N 2/06* (2006.01)
*H01L 41/047* (2006.01)

(56) References Cited

U.S. PATENT DOCUMENTS

| | | |
|---|---|---|
| 9,013,090 B2 | 4/2015 | Takahashi et al. |
| 9,595,660 B2 | 3/2017 | Akiyama et al. |
| 2014/0247227 A1 | 9/2014 | Jiang et al. |
| 2014/0368440 A1 | 12/2014 | Polyakov et al. |
| 2015/0044386 A1* | 2/2015 | Vilkomerson .......... H01L 41/29 427/485 |

FOREIGN PATENT DOCUMENTS

| | | |
|---|---|---|
| KR | 1020110088514 A | 8/2011 |
| WO | 2007091443 A1 | 8/2007 |
| WO | 2011/114965 A1 | 9/2011 |

\* cited by examiner

ACTUATOR DEVICE BASED ON AN ELECTROACTIVE POLYMER

CROSS-REFERENCE TO PRIOR APPLICATIONS

This application is the U.S. National Phase application under 35 U.S.C. § 371 of International Application No. PCT/EP2017/061576, filed on May 15, 2017, which claims the benefit of EP Patent Application No. EP 16170172.7, filed on May 18, 2016. These applications are hereby incorporated by reference herein.

FIELD OF THE INVENTION

This invention relates to an actuator device which make use of electroactive polymers, a controller for actuating such a device and methods for operating such actuator device or controller.

BACKGROUND OF THE INVENTION

In actuator devices of which the actuation is based on electrical stimulation of electroactive polymer (EAPs), the actuation is caused by a change in size and/or shape of the EAP material. EAPs combine a number of advantageous properties when it comes to their application for actuators. Advantages of EAPs include: low operation power, small form factor, flexibility, noiseless operation, the possibility of high resolution, fast response times, and cyclic actuation. But, while they can work as transformers for transforming electrical power into mechanical power, by virtue of their organic polymeric nature, they can also be easily manufactured into various shapes allowing easy integration into a large variety of devices and systems.

As an example of EAP device operation, FIGS. 1 and 2 show two possible operating modes for a exemplary EAP devices. The devices comprises an EAP structure including an EAP layer 14 sandwiched between electrodes 10, 12 attached to opposite sides of the EAP layer 14. While in FIG. 1 the EAP layer including electrodes is freely moveable, in FIG. 2 the whole EAP structure is clamped (attached) with one side to a support or carrier layer 16. A drive signal applied to give a voltage difference over the electrodes 10 and 12 is used to cause the EAP layer to contract in its thickness direction to thereby expand in the lateral directions. With dielectric elastomeric EAPs this is due to contractive force applied by electrodes to the EAP layer causing layer thinning, while piezoelectric and/or electrostrictive EAPs can also function (contract) via direct coupling with the electric field thus not needing contact of the electrodes to provide a contracting force. While in FIG. 1, this actuation leads to symmetrical deformation in the form of expansion in the indicated directions (arrows in FIG. 1) accompanied by layer thinning (lateral expansion with thinning) of the EAP layer due to the layer being freely suspended, the same actuation in FIG. 2 (arrows in FIG. 2) leads to bending of the device due to the restrained freedom of motion by the clamping on one side. Using device engineering a vast variety of device outputs can thus be designed and invoked upon actuation of the EAP layer. To obtain the asymmetric curving around an axis as shown in FIG. 2, molecular orientation (film stretching) may for example be applied, forcing the movement in one direction. The bending may result from the asymmetry in the EAP polymer, or it may result from asymmetry in the properties of the carrier layer, or a combination of both.

SUMMARY OF THE INVENTION

The inventors have found that for EAP actuators, when used in applications that require actuation for prolonged and/or frequent periods of time, the actuation is not always constant over time and/or that the drive versus actuation curve of different subsequent actuation periods of a device changes over time, i.e. a curve drift occurs. This hampers practical application of the actuators.

There is therefore a need for an improved actuator and a method of operating such actuator to reduce or remove the aforementioned problems.

This object is achieved at least partly with the invention as defined by the independent claims. The dependent claims provide advantageous embodiments.

According to the invention there is thus provided an actuation method, a computer programmed product for performing the method and a device adapted to use the actuation method in which device and method a reset signal is employed before and/or after one or more actuation events.

That fact that a reset signal as defined by the invention can be used to reduce the aforementioned problems, is based on the recognition that:

for actuation of an EAP actuator often a large electric field of the order of tens of Volts per micron EAP layer thickness is used to drive/actuate them and these high actuation fields are a cause for several interfering processes such as e.g. field dependent charge transportation and polymer structure (e.g. local dipole reorientation and/or crystallite reorientation and/or polymer molecule reorientation, etc.) relaxation effects to occur all of which occur next to that of the actual driving/actuation;

the relaxation effects have mutually different response to variation of applied field and actuation time as their time constants with which they occur are generally different. Hence the final state of an actuator in terms of the result of interfering processes is dependent on actuation history and thus variable or even unpredictable;

while during actuation the relaxation effects are field driven, after actuation when no field is applied, back relaxation occurs or needs to occur in absence of a field and consequently is much slower. Hence, while back relaxation is also history dependent for the same reason as relaxation is, it may also not be complete after some actuation cycle or wait time.

The above effects of the interfering processes may be especially pronounced in polymeric materials as compared to inorganic electroactive materials, as a consequence of their, at least partly, disorderly molecular structure. Such molecular structures generally obstruct resumption of an original structural state after changes of structure due to driving. Hence depending on actuation history, the actuator after an actuation may be left in a state with variable, often unpredictable, "trapped" deficiencies giving a shift of start actuation state and/or drift of the drive-actuation curve during successive actuations.

With the invention, one or more of the above effects can be counteracted. Thus, for example the effects of motion and possible trapping of charged or dipolar species and/or (re)-orientation of (polar) species (molecules or molecular parts) within the actuator, and especially the EAP, that are caused and driven by the electric field across the actuator can be counteracted. The build-up of (semi-permanent) charged species layers or polarized species layers may influence (e.g. cause a higher voltage required to achieve the same actuation) the actuator device operation by increasingly shielding the applied actuation field and this can be reduced or even prevented with the invention. Also the effect of having an unintentional actuation at rest state of the actuator (e.g. at non-actuation drive signal application or differently stated, without the application of an actuation signal) caused by the build-up of semi-permanent charged species or re-orientation of EAP molecules, ions or other species can be reduced or prevented. Furthermore, the effect of aging and electrical breakdown of the actuator caused by mechanical motion and wear, accumulation and trapping of charged species possibly at defect sites may be reduced or prevented. Importantly, one or more of the above advantages can be at least partly achieved without compromising the required actuation of a device.

The device may be an actuator device. The drive signal is meant and used to cause a desired actuation of the electroactive polymer actuator and therewith of the device. The reset signal is not for providing the desired actuation output. It is part of the control signal, but is meant and used for compensating actuation offset drift of the electroactive polymer actuator. Such drift can be caused by the drive signal. The drive signal can have a drive signal duration to cause the actuation. The reset signal preferably is applied outside the drive signal duration, but can also be part of it.

A reset signal precedes and/or follows the drive signal. In either case there can be a delay time or not between the two.

A simple form of reset signal is a block pulse signal.

The reset signal has a level which is smaller than a level of the drive signal. By 'level' is meant the magnitude of the signal, or, for example where the signal is a periodic or cyclical signal, an amplitude or peak magnitude of the signal. The level may therefore refer to a 'peak level' and is to be interpreted throughout this application as synonymous with the term 'peak level'.

The drive signal can have a drive signal level and the reset signal can have a reset signal level, wherein the reset signal level is equal to, or less than the product of a level scaling factor and the drive signal level, the level scaling factor being chosen from the group consisting of: 0.5, 0.2, 0.1, 0.05, 0.02, 0.01.

Although the reset signal is not meant and used for generating a desired actuation output (that is the function of the drive signal), in some cases it may cause a temporary potentially disturbing actuation output. The smaller the reset signal level or amplitude, the smaller an associated temporary actuation response will be. If the drive signal level is not constant (as with a varying, pulsating or even alternating drive signal), a maximum drive signal level such as a peak signal level or amplitude can be used. Likewise, if the reset signal level is not constant within a reset signal duration (as with a varying, pulsating or even alternating reset signal), a maximum reset signal level such as a peak signal level or amplitude can be used.

The reset signal can have a reset signal level such that the electric field across the electroactive polymer structure caused by the reset signal when applied to the electrode arrangement is between 10 volt per micron and 300 volt per micron.
Preferably it is between 10 Volt per micron and 50 Volt per micron.

The reset signal can be applied during a reset signal duration which is between 0.01 seconds and 1 second. A reset signal of this duration is generally long enough to have a substantial improving effect, and short enough to not markedly disturb a frequency of use for actuation. Preferably, the reset signal duration is greater than 0.05 or even greater than 0.1 seconds. In combination with this, or alternatively, the rest signal duration can be less than 0.5 seconds. The shorter reset signal pulses, possibly of high reset signal level (e.g. up to half of a drive signal level) may be used to generate less of a temporary actuation responses, especially if the electroactive polymer mechanical response time is very much different from the signal reset pulse periods.

The drive signal can have a drive signal level and a drive signal duration and the reset signal can have a reset signal level and a reset signal duration, wherein an integral of the reset signal level over the reset signal duration is equal to, or smaller than the product of an integral scaling factor and an integral of the drive signal level over the drive signal duration, the integral scaling factor being chosen from the group consisting of: 0.5, 0.2, 0.1, 0.05, 0.02, 0.01. Compensation is based on an averaging metric based on integral of signal level (field) times application time of the signal level. In some cases this can give a good compensation balance. In cases with drive signals having both polarities, the integral of the drive signal is preferably based on the non-absolute values of the signal levels so that the effect of polarities is averaged out in the calculated value.

The drive signal can have a drive signal duration, wherein:

during the entire drive signal duration, or an end portion of the drive signal duration, the drive signal has a first polarity and the reset signal comprises at least one part of a second polarity opposite to the first polarity. If the entire drive signal, or its end portion was a positive (first polarity) signal, then a reset signal of negative (second polarity) is used and vice versa. As the direction of electric field due to the drive and reset signals within the EAP structure is dependent on polarity of the signals, opposing polarities may cancel unwanted effects that may lead to the observed unwanted drift of actuation curves. This is a simpler way of compensating than using the integrals of drive signal levels and/or reset signal levels over their durations.

The reset signal can comprise or consist of a variable signal. A variable signal is a signal with changing signal level during its signal duration or application time. It may be a single pulse signal with randomly changing level. The single pulse signal can be a block pulse, triangular pulse, sinusoidal pulse or any other shape pulse with varying signal level. The single pulse can be symmetric in time or asymmetric in time with steep increase and shallow decrease or vice versa. The decrease and increase may occur according to different functions. The shape of the pulse can be chosen according to need as tested on a particular electroactive polymer actuator. A reset signal of this type effectively is a type of shakeup signal with many different field strengths. Hence, disturbing effects requiring different may be more effectively relaxed during its application to the electroactive polymer actuator. The variable signal can have a randomly varying signal level gradually increasing, gradually decreasing or having increasing and decreasing parts during its duration.

The reset signal comprises or consists of a plurality of reset signal pulses.

Such reset signals provide a relaxation shakeup for every pulse, i.e. several shakeups per reset signal. Some disturbing effects may require multiple shakeup for their effective relaxation. Preferably the number of pulses is chosen in the range of 2 to 20. More preferably it is in the range of 2 to 10. Even more preferably it is in the range of 5 to 10. Reset signal Pulses may have equally long durations or have different durations. The pulses may be randomly organized with respect to e.g. duration, signal level and or shape.

Alternatively, they may be organized in the form of one shape of pulse and/or one signal level and/or one duration. There may thus be a train of equal level signal pulses with the same duration per pulse or e.g. reduced pulse length for every next pulse in the reset signal. In between any one pair of successive ones of the plurality of reset signal pulses there may be a relaxation time or not. A relaxation time is a time period with a zero drive signal applied.

The reset signal comprises or consists of an alternating signal having a constant or varying period. Such an alternating signal can for example comprise one or more of the plurality of reset signal pulses.

Each of the reset signal pulses can have a maximum reset signal pulse level and the absolute value of the maximum reset signal pulse level reduces for each next one of the plurality of reset pulses within the reset signal. Disturbing effects requiring an intense reset pulse are made to relax first and a next lower intensity pulse will not annihilate the entire obtained reset as every next pulse is not intense enough to actuate the most difficult to activate ones that were made to relax with a previous pulse. Hence the relaxation is brought about gradually.

The reset signal can comprise at least a first polarity and a second polarity opposite to the first polarity. Compensation for disturbing effects may require periodic inversion of electric field within the electroactive polymer structure. Some effects need a so to say shakeup in two directions before they can relax. This is achieved with bipolar signals or signals having both polarities. Different polarity reset signals may be used for this. Preferably, the reset signal is, or comprises a part which is, an alternating signal with a constant or varying period. If the reset signal comprises a plurality of reset signal pulses, each pulse may have one particular polarity. In case of an alternating reset signal, successive pulses may then have opposite polarities.

The method can further comprise:
providing a lookup table comprising drive signal data for defining a plurality of drive signals and reset signal data for defining a plurality of reset signals, each one of the drive signal data being related to one of the reset signal data;
upon definition of a drive signal, retrieving from the lookup table reset signal data for a reset signal based on one or more drive signal data within the lookup table;
generating the drive signal and the reset signal of the control signal using the reset signal data and the retrieved reset signal data;

Direct match of reset signal data and drive signal data can be used. Alternatively, if there is no exact match between required drive signal data (for an actuation drive signal) and drive signal data in the lookup table, an interpolation may be used to determine, from the corresponding reset signal data, the suitable required reset signal data.

In the invention the method can further comprise:
determining an actuation history of the electroactive polymer actuator; and
generating a reset signal based on the actuation history.

Actuation history may include any one of the following: tracking of signal levels, polarities and/or number of drive signals provided over time, tracking of actuation output of the actuator over time. The idea is that after more strenuous actuation, and/or more single polarity based actuation and/or a larger number of actuations, a more powerful reset signal may be applied. This can still be done using a predefined lookup table. Based on the number of actuations provided in succession a desired reset pulse can be provided. Thus for example, the more drive signals were provided, Preferably actuation output at rest state of the actuator and before or just after an actuation is tracked e.g. by (temporarily) storing values to be able to compare them. If deviation from a predetermined reference value becomes larger than a predetermined threshold, then a reset pulse may be provided to correct. This reset pulse may be adjusted according to the difference determined.

The reset signal can:
follow and/or precede every drive signal or a plurality of drive signals.

Sometimes it is not needed to have a reset signal per every drive signal. This increases the actual up time of the actuator as reset signals take time without providing actuator output.

Preferably, one or more (subsequent) drive signals is followed by a reset signal. More preferably, every drive signal is followed by a reset signal.

One or more subsequent drive signals can be preceded by a reset signal and followed by a reset signal. Thus every drive signal can be preceded and followed by a drive signal. But, there may also be a reset signal for a group of drive signals. This can mean that between two drive signals there may be at least two reset signals, one following the first drive signal and another one preceding the second drive signal. The preceding signal provides a fresh staring point from which to start driving while the reset pulse following the drive signal has its usual effect.

Preferably this configuration is combined with feedback or history tracking of the actuator to have better control over actuation output curve drift.

The invention provides for a computer program product comprising computer readable code stored on, or storable on a computer readable medium, or downloadable from a communications network, which code, when executed on a computer, can cause or causes execution of the steps of any one of the methods as claimed in claims 1 to 14. The method of the invention can thus be implemented in software that is capable of controlling a controller possibly including a signal generator for controlling an electroactive polymer actuator to make it actuate as desired.

The device can comprise a processor and a memory, the memory having stored therein the computer program product of claim 13 and the processor being arranged for executing the computer program product. Optionally the device can include user input and/or output devices and related interfaces for operating the device either automatically or by hand.

All features for the method and their advantages can be translated into features of the computer program product or controller by adaptation of the controller or computer program product. The processor can be a semiconductor processor such as a central processing unit etc. The memory can be a RAM or ROM memory of any kind which can be accessed by the processor. Such memory may include SD or Flash, Harddisk, or optical such as CD or DVD or Blue Ray. The memory can be comprised in a computer readable medium. Alternatively, the computer readable medium can be a communications network such as LAN or WAN or other data network from which the computer program can be downloaded.

The controller can comprise:
an electrical power source for generating electrical signals of the first polarity and of the second polarity for use in the electrical drive signal; or
an electrical power source for generating electrical signals of at least the first polarity or at least the second polarity for use in the electrical drive signal and a switching arrangement for switching the coupling of the electrical drive signal to the electrode arrangement. With the switching of the coupling, the switching from the first polarity to the second polarity or vice versa can be achieved.

The controller may comprise a signal generator for generating opposite polarity signals. Alternatively, the driver may comprise a signal generator for generating single polarity signals and a switching arrangement for coupling the driver output to the electrode arrangement. These provide alternative ways to provide opposite polarity signals to the EAP layer. A simplified and cheaper signal generator can be used when the switching unit is employed.

Measures for modification as described for the system or device can be used to modify the corresponding method. Such modification can have the same advantages as described for the system or device claimed or described.

BRIEF DESCRIPTION OF THE DRAWINGS

Examples of the invention will now be described in detail with reference to the accompanying schematic drawings, in which like numerals represent the like features and in which.

DETAILED DESCRIPTION OF THE EMBODIMENTS

Figure 1:
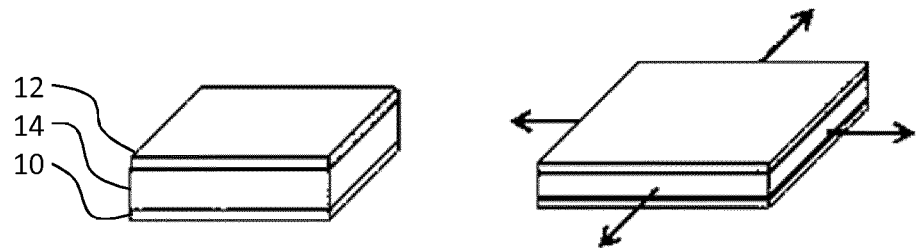
FIG. 1 shows a known electroactive polymer structure which is not clamped for linear actuation in plane.

The electroactive polymer actuator comprises an electroactive polymer structure EAP that defines a non-actuated state and at least one actuated state (different from the non-actuated state) attainable by application of an electrical drive signal to the EAP structure. The actuated state provides an actuation in the form of a mechanical actuation which can be a force (pressure), change of fore (pressure) and/or stroke provided by the structure due to propensity of the EAP structure to deform upon application of the drive signal.

The electrical drive signal is provided to the EAP structure with an electrode arrangement having one or more electrodes for receiving a control signal. The EAP structure may be between (e.g. sandwiched between) electrodes of the electrode structure. Alternatively, electrodes can be on a same side of the EAP structure. In either case, electrodes can be physically attached to the EAP material either directly without any (passive) layers in between, or indirectly with additional (passive) layers in between. But this need not always be the case. For example for relaxor or permanent piezoelectric or ferroelectric EAPs, direct mechanical contact with electrodes is not necessary. In these cases electrodes in the vicinity of the EAPs suffice as long as the electrodes can provide an electric field to the EAPs. However, for dielectric elastomers as EAPs, the electrodes need to be in physical contact (such as e.g. attached to) the EAP material such that an electric field applied to the electrodes can impose a force to the EAP that makes the EAP deform. Thus, the electrodes can be part of the electroactive polymer structure.

Within the context of the invention, the drive signal and the reset signal can be a voltage signal (voltage driving) having voltage signal levels or a current signal with current signal levels (current driven). The current signal will be accompanied by associated voltage differences across the electrodes. When provided to the electrode arrangement, the electrical drive signal and reset signal causes voltage differences between the electrodes of the electrode arrangement, which in turn cause an electric field over at least part of the EAP structure. By definition, for an electrical signal causing voltage differences over the electrodes having only positive or only negative voltages (with respect to one reference), the drive signal and related voltage differences are defined to be unipolar. Likewise, for a signal causing voltage differences of opposite polarity, the voltage differences of drive signal and reset signal are defined to be bipolar. A drive signal and voltage difference of 0 V is defined to have no polarity, as it is neither positive nor negative.

The invention involves providing to an electroactive polymer structure of an actuator a reset signal before and/or after one or more actuation signals for one or more actuation events. The reset signal causes relaxation of trapped charge, dipoles and/or other defects in the EAP so that upon a subsequent actuation using a drive signal, the initial actuation state is defined to be more constant than without use of the reset signal.

The invention is applicable to actuator devices that have an electroactive polymer structure including an EAP material, where the structure is capable of providing a mechanical actuation upon subjection of at least part of the EAP material to an electrical drive signal. The mechanical actuation is based on the EAP being capable of causing the structure to deform when the electrical drive signal is applied.

Many different of such actuators can be devised, but only some exemplifying ones will be described herein below to show how the invention can be put to use. Nevertheless, the invention can be applied to all EAP based actuators or other polymer actuators with are driven using voltages and which show similar relaxation effects.

Figure 2:
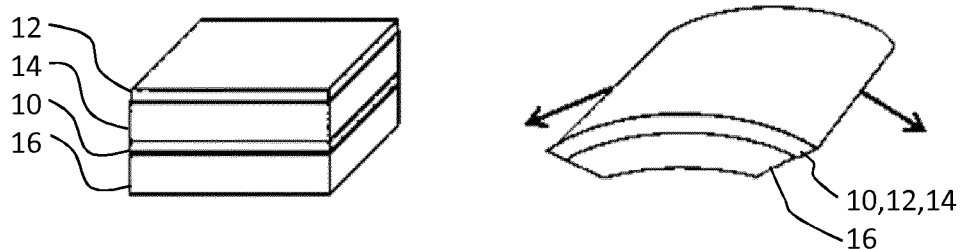
FIG. 2 shows a known electroactive polymer structure which is constrained by a backing (carrier) layer for bending actuation out of plane.

FIGS. 1 and 2 show exemplifying EAP structures that can be used in actuator devices according to the invention. An exemplifying actuator device including the actuator structure of FIG. 1 and a driver 30 is depicted in FIG. 3. The structure of FIG. 1 has been described in the introduction of this application. FIG. 3 shows the driver 30 to be connected to the electrodes 10 and 12. The EAP layer 14 in this case is a dielectric elastomeric polymer with constant layer thickness across the electrode area. The electrode 10 is grounded (at zero potential or voltage) for a reference and the electrode 12 is connected to an output from the driver 30 which is capable of providing an electrical control signal in the form of varying, variable or adjustable voltage levels during predefined or adjustable time periods to the electrodes. The ground connection can be a general separate ground connection (not shown), but in this case is supplied by another output of the driver which in turn is connected internally to a common ground (e.g. of socket). The driver 30 contains a switching unit either internally as shown, or externally for using voltages of the voltage source in order to generate the electrical driving signals to be applied to the electrode arrangement. Thus, in this case the driver is adapted to apply drive signals with bipolar voltage levels to the electrode 12 such that the voltage levels together with the ground signal define voltage differences with associated positive (first polarity) or negative (second polarity) polarities (and hence electric field directions) between the electrodes. Therewith, the direction of the electric field between the electrodes and thus provided to the EAP material can be reversed. Either the electrode 12 or 10 can be used as a reference to determine the sign of polarities (direction of electric field). In this case polarities are determined with respect to the grounded electrode as a difference between signal on electrode 12 and ground signal. Any other reference voltage can also be used as long as the voltage levels of the drive signal are then adjusted such that the voltage difference comprises positive and negative voltage differences with respect to e.g. the reference electrode.

It will be appreciated by those skilled in the art that the voltage differences can also be generated by using drive signals supplied to both electrodes, again, as long as they are composed such that the voltage differences caused, change polarity with regard to one chosen reference electrode according to the requirements of the invention.

Applying drive signals to the EAP structure can cause it to actuate in a manner as described in the introduction of this application.

Figure 3A:
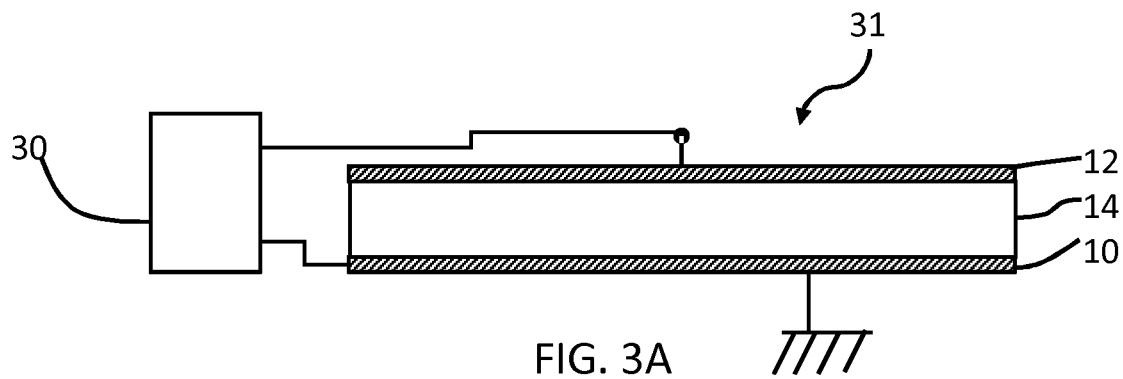
FIGS. 3A and 3B show a basic layouts of actuator devices including a driver connection. The actuator of FIG. 3B has two EAP layers 14 that share a common electrode 12.
Figure 3B:
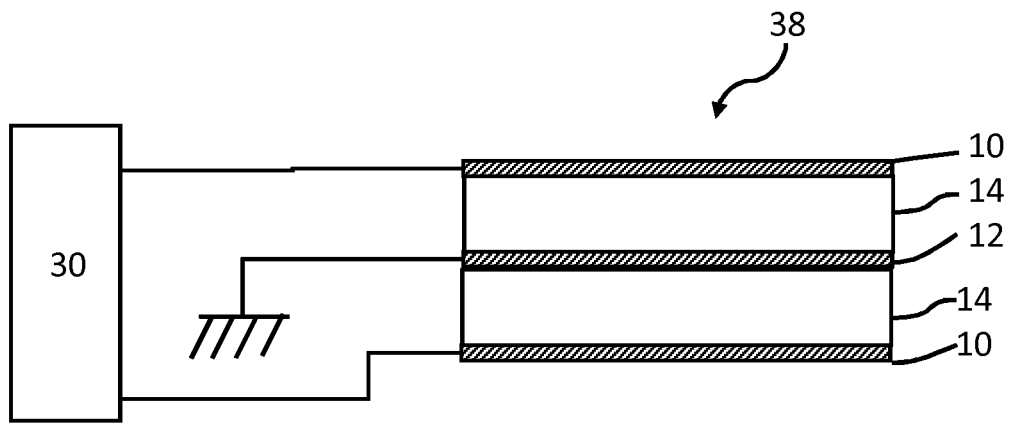

In the FIG. 3A, the actuator structure is a single EAP layer structure. This is a basic configuration. Alternatively, and often in practice a multilayer EAP structure is used which multilayer structure comprises a stack of at least two EAP layers wherein the stack alternately comprises the EAP layers and the electrodes. An example with two EAP layers and 3 electrodes is provided in FIG. 3B. Other numbers of layers and electrodes are also possible. The multi EAP layer structure allows, for example, to have a more powerful actuation, while actuation voltages can be kept lower for a same mechanical power output. Specifically in FIG. 3B, the multilayer stack effectively includes sub-stacks with electrodes 10 and 12 with an EAP layer 14 in between. Each sub-stack can be driven in the same way as the one of FIG. 3A using one and the same driver and suitable connection of the electrodes in order to provide the correct voltages to the EAP layers. Although many other configurations of actuators are possible, the invention works for all of them and hence an exemplifying multilayer stack will be used to explain the workings and effects of the invention. The exemplifying stacks were a Novansentis PVDF-relaxor type 1 HD. These are stacked actuators (12×14 mm) attached to a substrate (operating like in FIG. 2).

Figure 4:
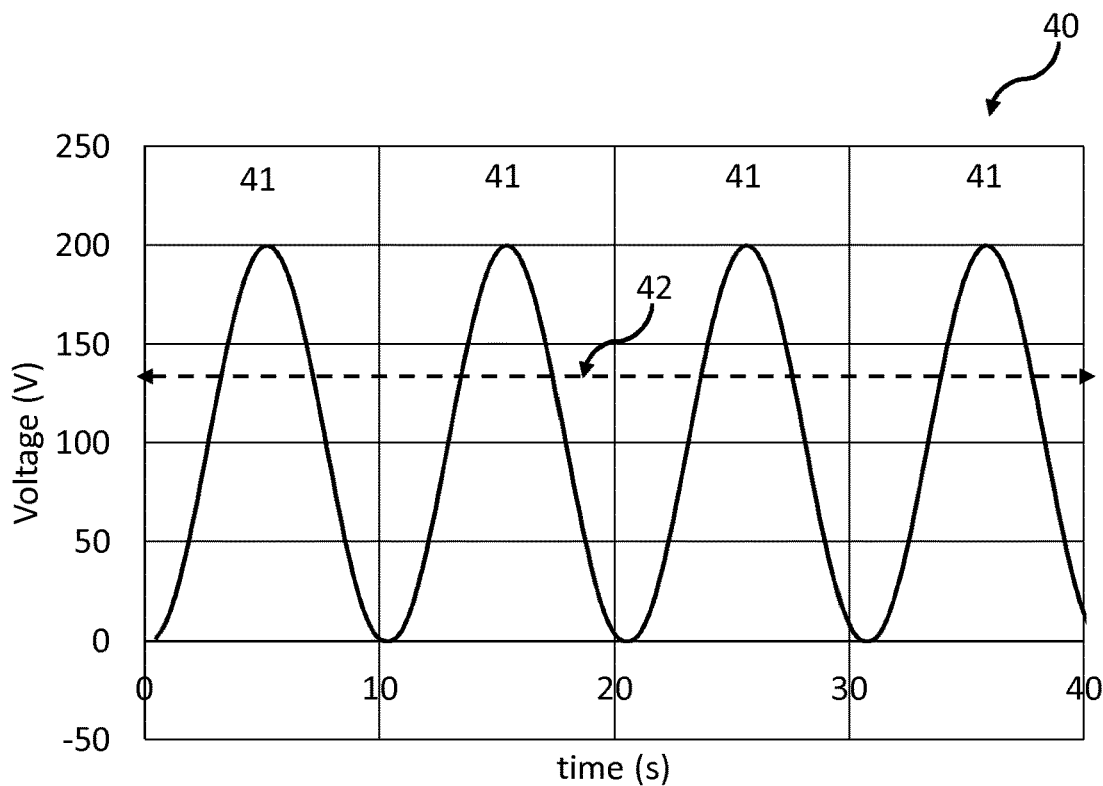
FIG. 4 shows a drive scheme without employing a reset signal according to the invention as applied to an actuator.
Figure 5:
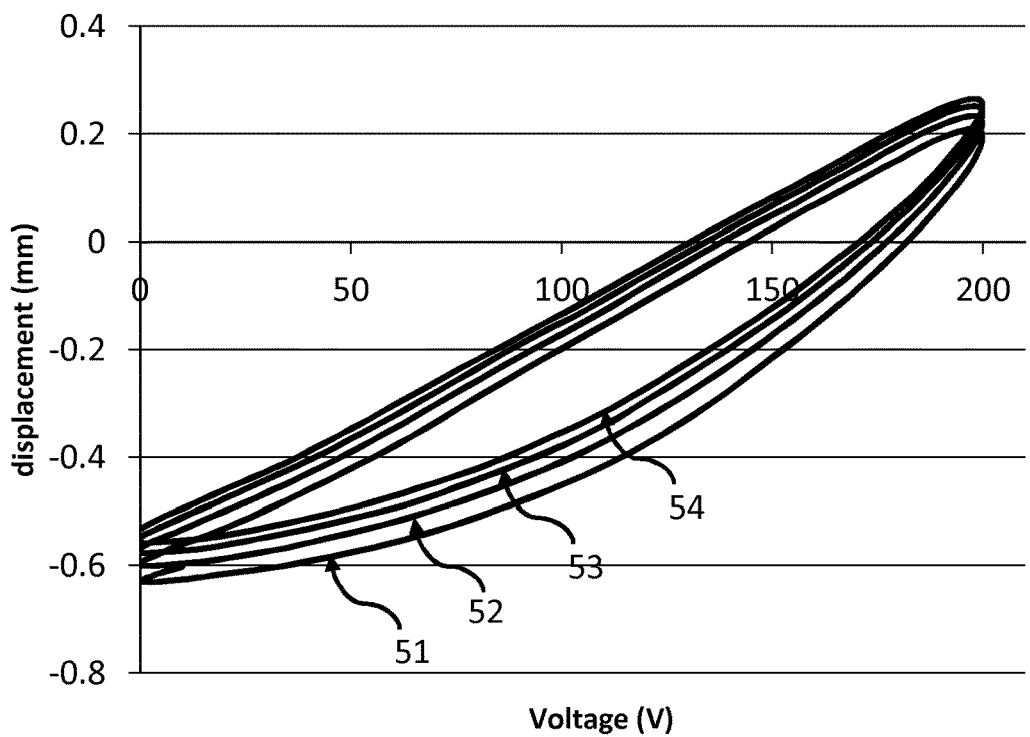
FIG. 5 shows the actuation cycles as observed by employing the drive scheme of FIG. 4 to the actuator of FIG. 4.

FIG. 4 shows a drive scheme (control signal) 40 with four consecutive drive signals 41 for causing four consecutive actuation events within a total time period 42 of 40 seconds. Each actuation drive signal is a sinusoidal voltage signal between zero and 200 volt (sinusoidal amplitude of 100 volt) with a period of 10 seconds. When the exemplifying actuator is driven with this driving scheme (control signal), the actuation curve representing the displacement of the EAP structure as a function of the drive scheme voltage is as shown in FIG. 5. The position of the vertical displacement axis has been arbitrarily chosen. The rest state (non-actuated state) of the device is at ~−0.6 millimeter at zero volt while maximum displacement is at ~0.2 millimeter at 200 volt so that actuation dynamic range is ~0.8 millimeter for a signals between 0 and 200 volt. Most notably, it can be seen in FIG. 5 that the 4 actuation curves 51, 52, 53 and 54 caused by the four sinusoidal drive signals of shift upward with every next actuation event. For each consecutive signal, the non-actuated state as well as the displacement reached at 200 volt is thus different.

This curve shifting effect occurs even when a rest period (a period wherein the EAP structure is not driven) is applied between consecutive actuation cycles. The effect is thus persistent and can be attributed to the aforementioned defects of trapped charge, dipoles etc within the EAP structure. Since it is among others strongly related to the nature of polymeric materials and the construction of the EAP structure (e.g. lamination and attachment of electrodes), the effect will be present to some extent in many if not all types of EAP structures. The effect hampers the application of EAP based actuators as desired actuations for same drive signals are not reproducible and/or dependent on use history.

Figure 6:
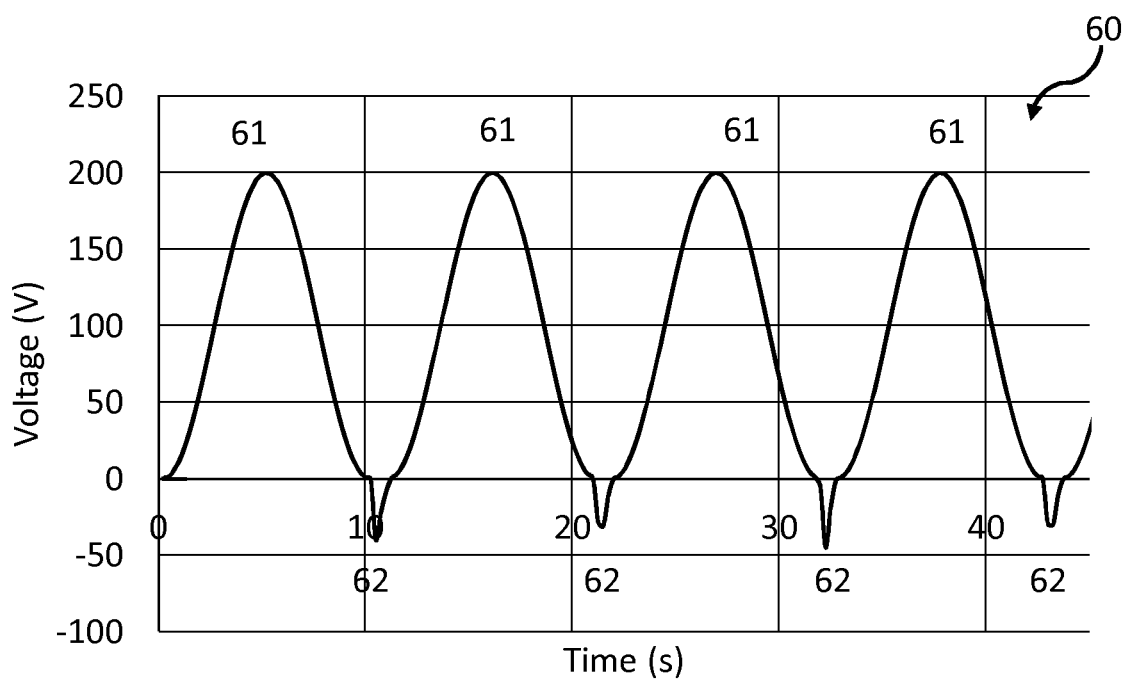
FIG. 6 shows a drive scheme with a single pulse triangular reset signal as applied to the actuator of FIG. 4.
Figure 7:
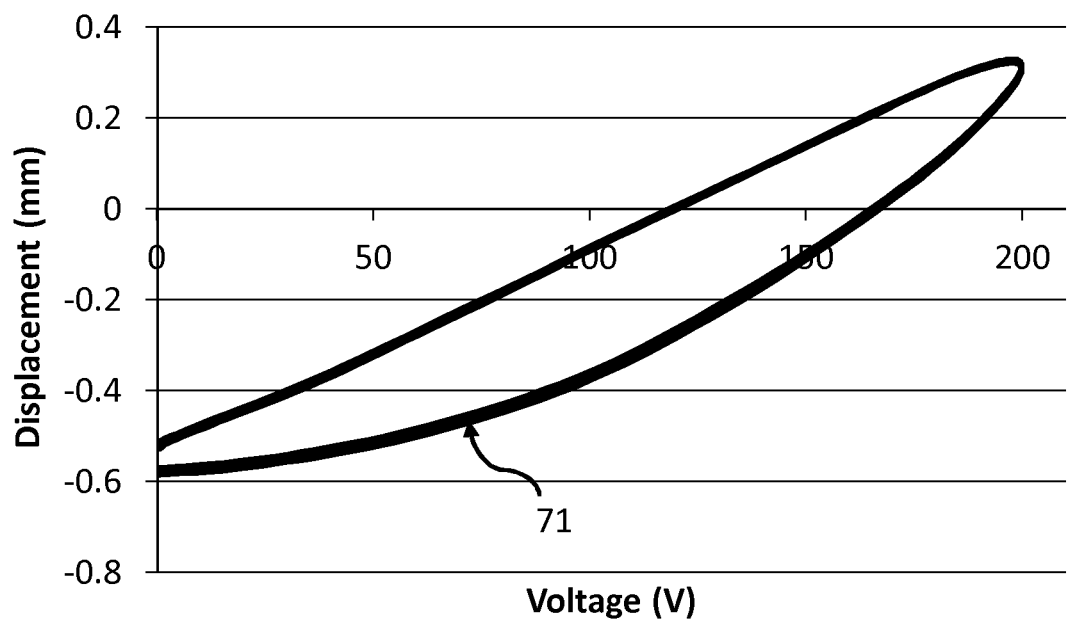
FIG. 7 shows the actuation cycles as observed by employing the drive scheme of FIG. 6 to the actuator of FIG. 4.

The invention aims to reduce or eliminate this effect. The example of FIGS. 6 and 7 are used to explain a first example of the invention. FIG. 6 shows a drive scheme (control signal) 60 with four consecutive sinusoidal drive signals 61 (for causing four consecutive actuation events) that are the same as those of FIG. 4. Each actuation drive signal is a sinusoidal voltage signal between 0 and 200 volt (sinusoidal amplitude of 100 volt) with a period of 10 seconds. Thus, the drive scheme is largely identical to drive scheme 40, with the exception that it includes 4 reset signals 62 according to the invention. More specifically, after each actuation drive signal there is a negative voltage, single peak, triangular reset signal 62 with an amplitude of −50 volt and a period of 0.1 seconds (represented by the downward directed spikes 62 in FIG. 6).

When the exemplifying actuator is driven with this driving scheme 60, the actuation curves representing the displacement of the EAP structure is as shown in FIG. 7. Analogous to the curves in FIG. 5, the position of the vertical displacement axis has been arbitrarily chosen. The rest state of the device is again at ~−0.6 millimeter at zero volt while maximum displacement is at ~0.2 millimeter at 200 volt so that, like in FIG. 5, actuation dynamic range is ~0.8 millimeter between 0 and 200 drive signal. However, as opposed to the curves of FIG. 5, the curves of FIG. 7 largely overlap, i.e. the upward shift of the curves in FIG. 5, is very much reduced in FIG. 7. Hence, the actuation is more reproducible and the endpoint displacement reached with every actuation drive signal is virtually identical. Moreover, the actuation trajectory along the voltage scale is also almost identical for the four different curves. Thus reproducibility of driving is thus largely improved.

Figure 8:
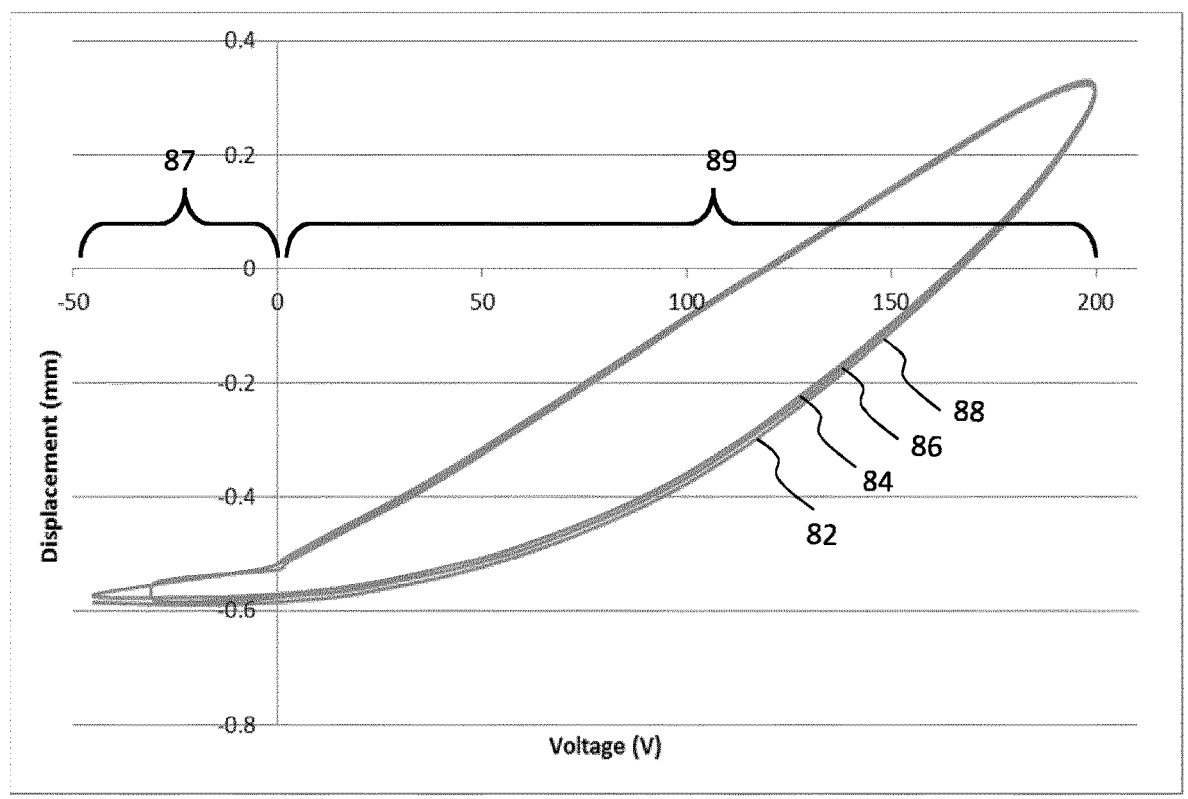
FIG. 8 shows the actuation cycle curves of FIG. 7 again, but now with actuation at the negative voltage polarity region included.

FIG. 8 shows the curves 82 to 88 which are the same ones as those of FIG. 7, but now not only as a function of actuation voltage range 89, but also as function of reset voltage range 87. Although the reset pulse does cause a displacement in this case, it is not of influence on the reproducibility of the attained displacement at positive actuation voltages as the curves of the four actuation cycles almost overlap. The displacement caused by the reset pulse of ~0.1 millimeter (measured at zero volt) is less than the residual displacement caused by the drift of ~0.15 millimeter (measured at zero volt in FIG. 5) of the actuator curve when no such reset pulse was used. Again this reset pulse caused displacement is constant and it can as such be taken into account for reaching or defining any absolute desired displacement to be achieved.

The invention thus has the important advantage of increasing reliability and precision of actuation during operation. The invention enables more stable and more accurate actuator performance without having to use closed loop operation for correction. Furthermore, non-ideal materials can be used regardless their non-ideal characteristics and complicated research to improvement of materials of EAP electrodes etc and structure of the EAP structure at least partly obsolete.

In the above example the reset pulse is a single pulse with a voltage polarity opposite to the polarity of the drive signals and each drive signal is followed by a reset pulse. However, many other configurations and variations can be used of which a number are described herein below.

Figure 9A:
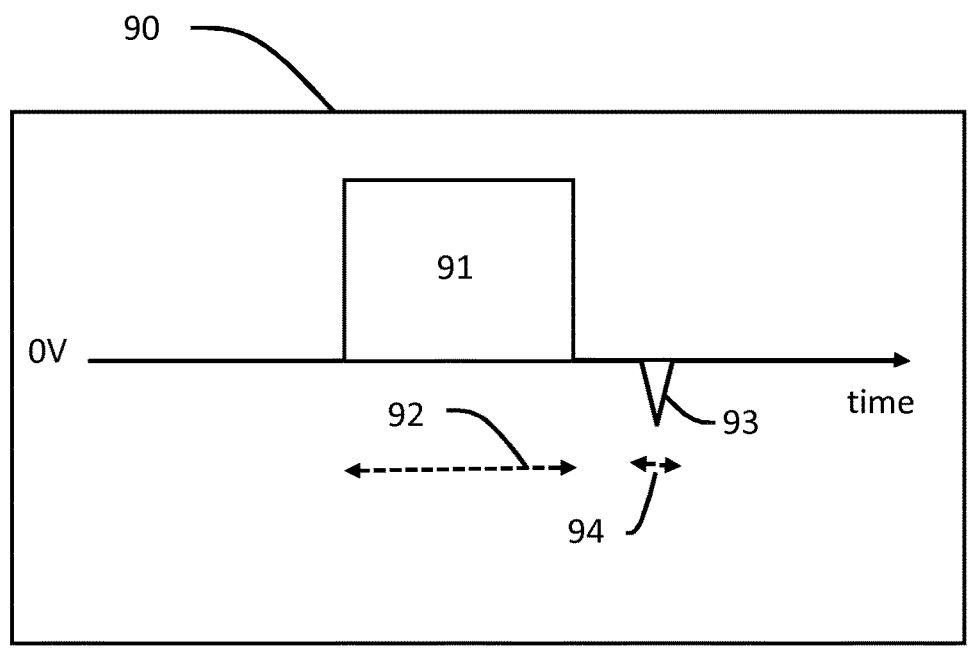
FIGS. 9A to 9C show control signal sequences.
Figure 9B:
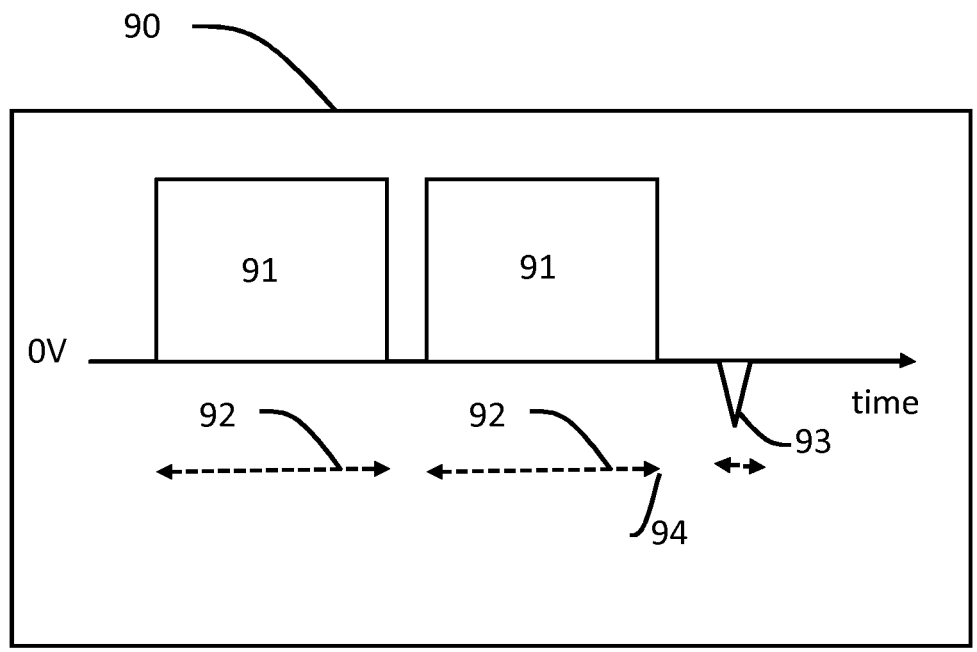

The control signal can have one or more drive signals for causing one or more actuation events. FIG. 9A shows a control signal 90 having one single drive signal 91 with a duration 92 and a reset signal 93 with a reset signal duration 94 after the drive signal 91 to compensate for any offset generating effects caused by the drive signal. Alternatively, there can be more than one drive signals per reset signal in a control signal. FIG. 9B shows a control signal 90 with two successive drive signals 91 followed by a reset signal 93. There can be a predetermined delay between the drive signals, but this is not necessary. The drive signals can be the same, but can also be different. There may be more than two drive signals per reset signal.

Figure 9C:
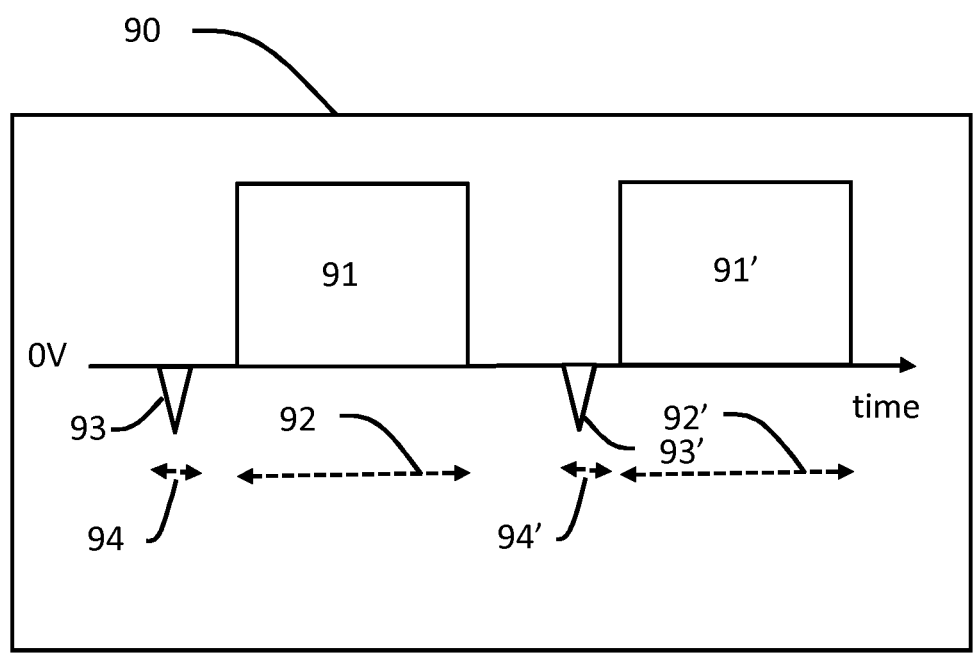

As with the examples of FIGS. 4 to 7, the reset signals of FIGS. 9A and 9B follow the drive signal(s) they are intended to compensate for. However, it is noted that, and this holds in general for the invention, this does not necessarily mean that the control signal should always have the reset signal following a drive signal. After all, a compensating reset signal could also be provided before the next drive signal and just be defined as part of the next control signal. FIG. 9C shows how this can be implemented. There are two drive signals 91 and 91' each with a corresponding reset signal 93 and 93' before the corresponding drive signals 91 and 91'. The reset signal 93' is now designed to compensate for the drive signal 91 of the previous drive signal 91, etc.

Figure 10:
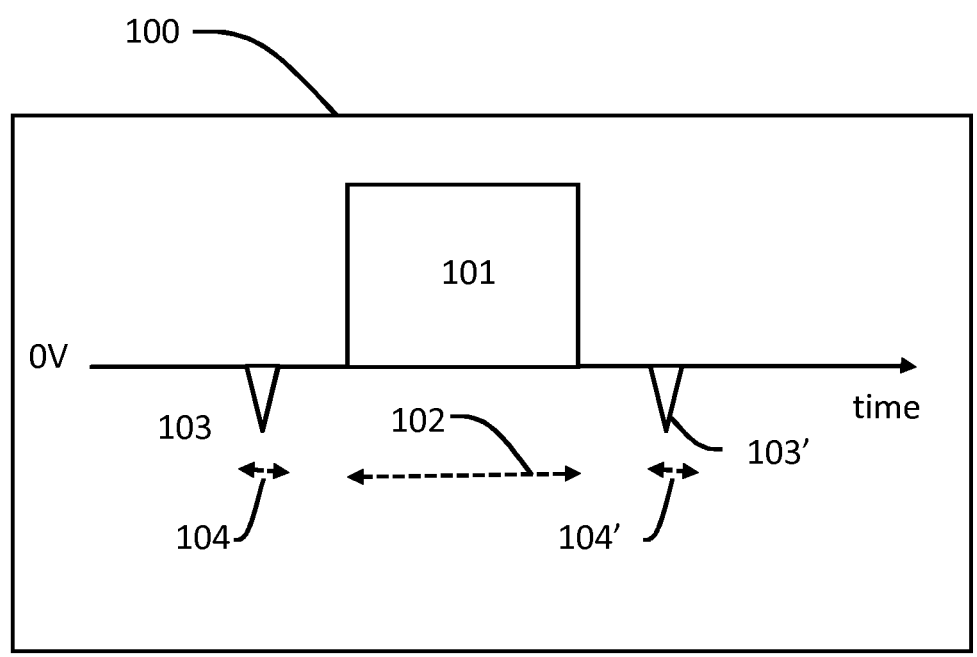
FIG. 10 shows a control signal with a reset signal before and after a drive signal.

The wait time between successive drive signals of a control signal can be according to desire from zero seconds to predetermined non-zero time according to a use requirement. If the wait time is long, it can be advantageous to have two reset pulses per one or more drive signals, i.e. one reset signal just before the one or more drive signals and one reset signal just after the one or more drive signals (FIG. 10). The reset signals just before and after one or more drive signals can be of opposite polarity or of the same polarity. There may be delay times between any signals, but this is not needed as this may generally depend on use requirements of the actuator. Using multiple control signals, each one having one or more reset pulses before and one or more reset pulses after a drive signal (e.g. as in the control signal 100 of FIG. 10), there can thus be multiple reset signals between successive drive signals during operation of an actuator device, i.e. one (last reset signal) stemming from a first control signal and one (start reset signal) stemming from a second control signal.

It is preferred that the reset signal has at least one part or at least one reset signal pulse that has an opposite polarity to the drive signal polarity. This will e.g. be advantageous when driving occurs with single polarity drive signals or where driving is done with predominantly one polarity drive signals. The opposite polarity of the reset signal will cause an opposite electric field direction to that of the driving signal within the EAP structure and any field dependent defects generated causing the offset phenomena during a driving signal may be reduced or counteracted by the reset signal. FIGS. 9 and 10 show reset signals with negative voltage (negative polarity) and drive signals with positive voltage (positive polarity) which is opposite to that of the reset signal.

Figure 11A:
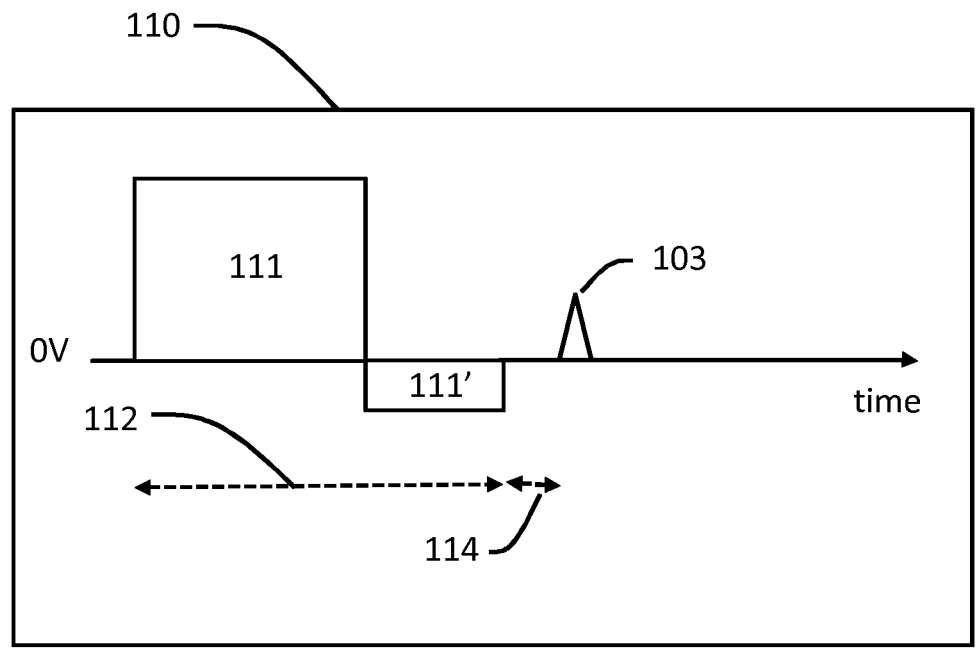
FIGS. 11A and 11B show control signals with different polarity reset signals.

If a drive signal has both positive and negative polarity signals, then different options are available. FIG. 11A shows a control signal 110 with a drive signal during a duration 112 which includes a first drive signal part 111 having a positive voltage and a further drive signal part 111' with a negative voltage with smaller level than the part 111. Such a signal may e.g be needed for an actuator that is capable of providing an actuation output direction dependent on the signal polarity.

If the second part 111' of the drive signal is capable of compensating for offset effects caused by the first part 111, then the reset signal can be used to compensate for any offset effects caused by the second part 111' of the drive signal. The reset pulse polarity may then be opposite to that of the part 111'. Other reset signal characteristics (see herein below) may (but need not) be entirely based on the second part of the drive signal 111' also in this case.

Figure 11B:
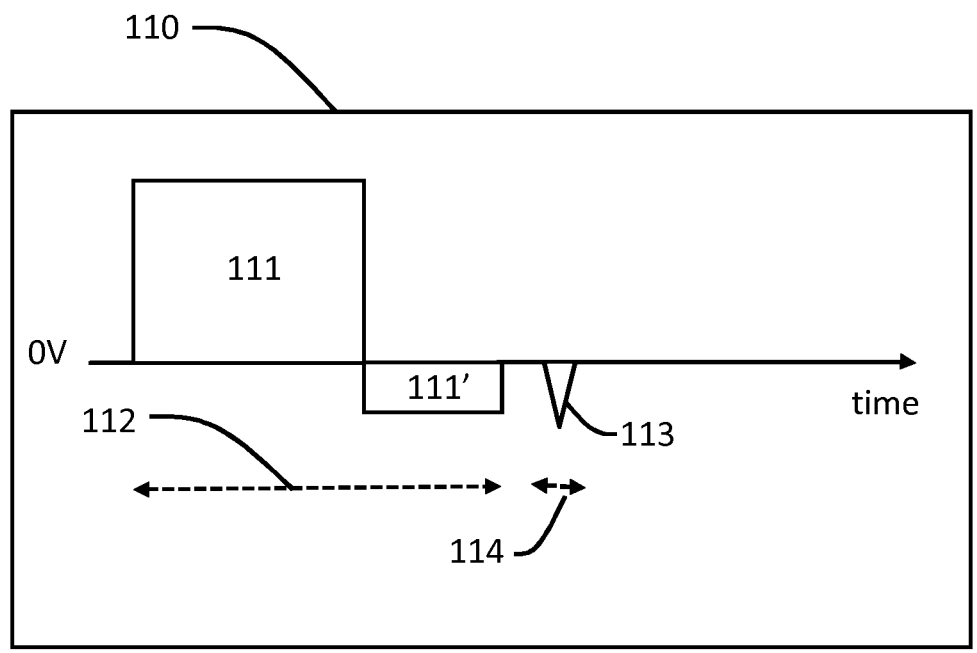

Alternatively, if the second part of the drive signal 111' is insufficient to negate any offset effects caused by the first part 111 of the drive signal, then the pulse polarity can be chosen opposite to that of the second part 111', i.e. same polarity as first part 111. This is shown in FIG. 11B. In these cases, the reset signal polarity can be chosen based on a metric representative for asymmetry around the signal level within a predetermined time period of e.g. the drive signal duration 112 comprising at least a part of the second part of the drive signal 111'. Such a metric could be the total area under the drive signal within the predetermined time period. For example in FIG. 11B, the integral of voltage over time within duration 112 would result in a positive value, indicating that the reset pulse needs to have at least a same polarity part. The sign of an average of the signal level over the predetermined period can also be used as the metric and those skilled in the art can think of yet other such metrics. The predetermined time period need not be the entire duration 112 and can be shorter, but using the entire period is advantageous as it may account for signal level changes and/or relative durations of both parts 111 and 111', and maybe oven over an entire control signal period.

In some cases the reset signal can have the same polarity as the drive signal and does not need any opposite polarity parts. The reset pulse can then be to dislodge kinetically trapped defects that may cause part of the offset effects. However, as said before, this is not the preferred way for most cases. In any case, it will be clear that if the reset signal polarity does not need to be different from the drive signal polarity, then the driver 30 of an actuator device such as the one of FIGS. 3A and B does not need to be capable of providing both polarities.

In the previously described examples, a reset signal included only one reset signal pulse. However, the reset signal can have various shapes or waveforms including ones that effectively define them to have multiple reset signal pulses. Reset signals such as variable signal (random or not), pulsating signals, or even alternating signals can be used. A variable signal can be a continuously changing signal or a stepped signal of one polarity or of two polarities.

In one group of examples, the reset signal includes a plurality of reset signal pulses. Such reset signal can be a shakeup type of signal for disturbing defects several successive times to achieve a further improved reduction of curve shift effect. For example, It has been verified experimentally for the exemplifying actuator above that a reset signal with a plurality of unipolar reset signal pulses within a reset signal duration gives an improved relaxation effect as compared to a reset signal with a single reset signal pulse of the same type and with a reset signal period equal to the reset signal duration of the multipulse signal.

Figure 12A:
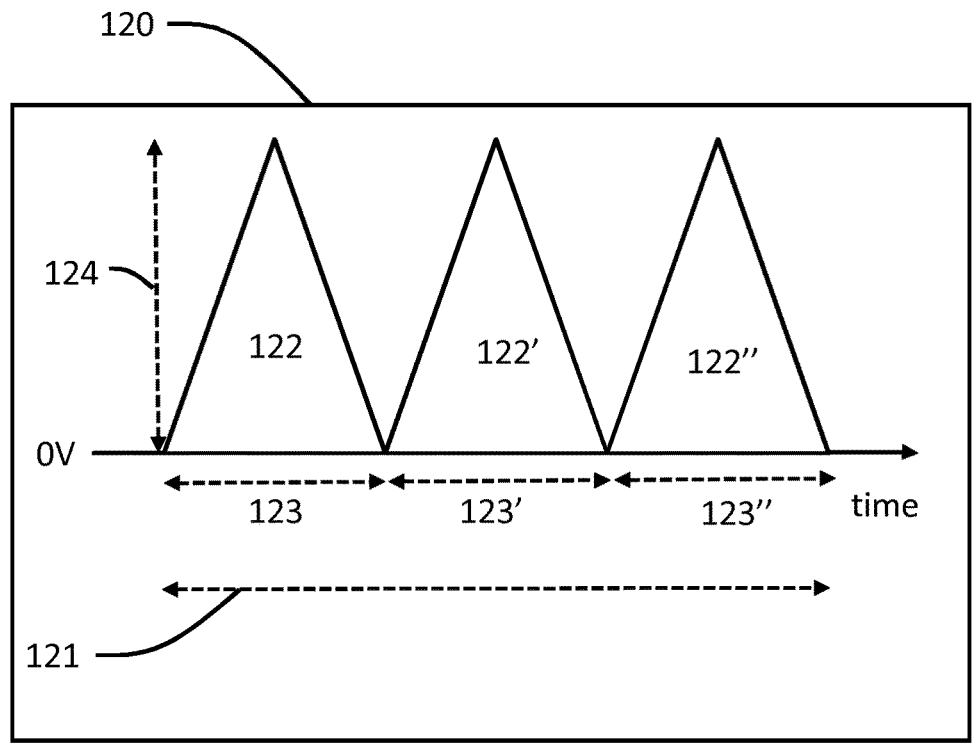
FIGS. 12A and 12 B show a pulsating reset signal with constant amplitude and a pulsating reset signal with decaying amplitude, respectively.
Figure 12B:
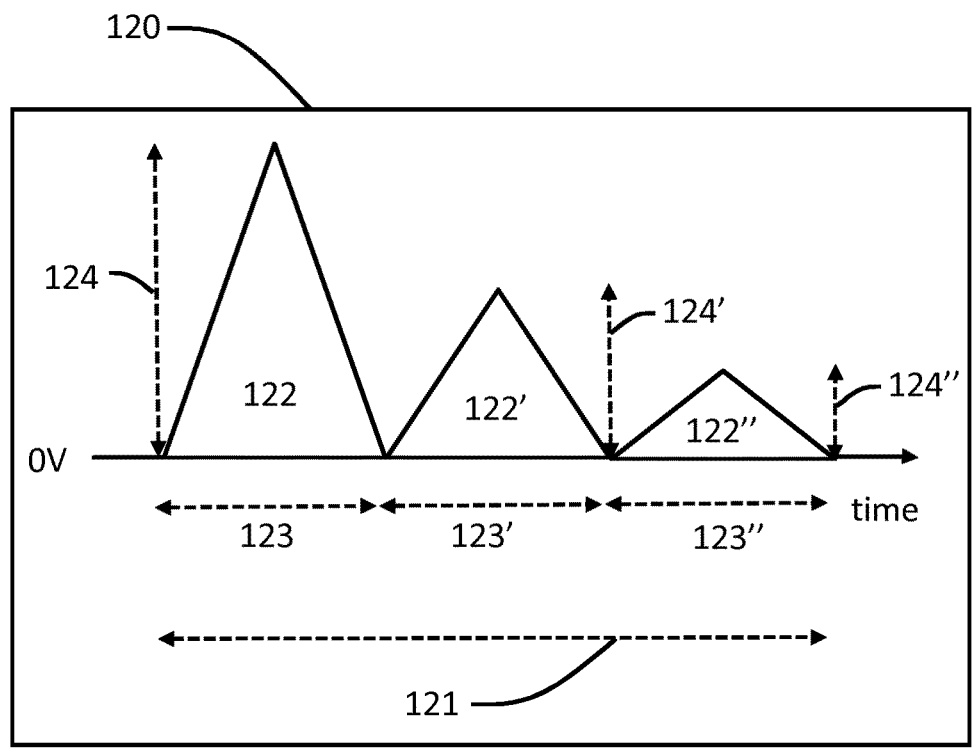
Figure 13A:
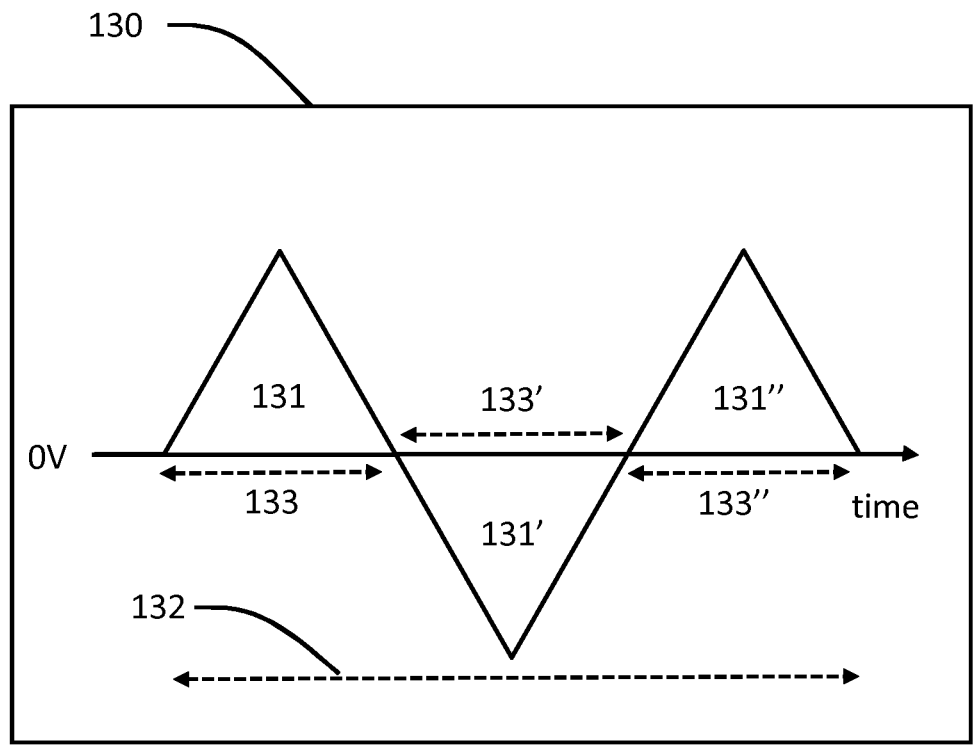
FIG. 13A shows an alternating reset signal without decay.
Figure 13B:
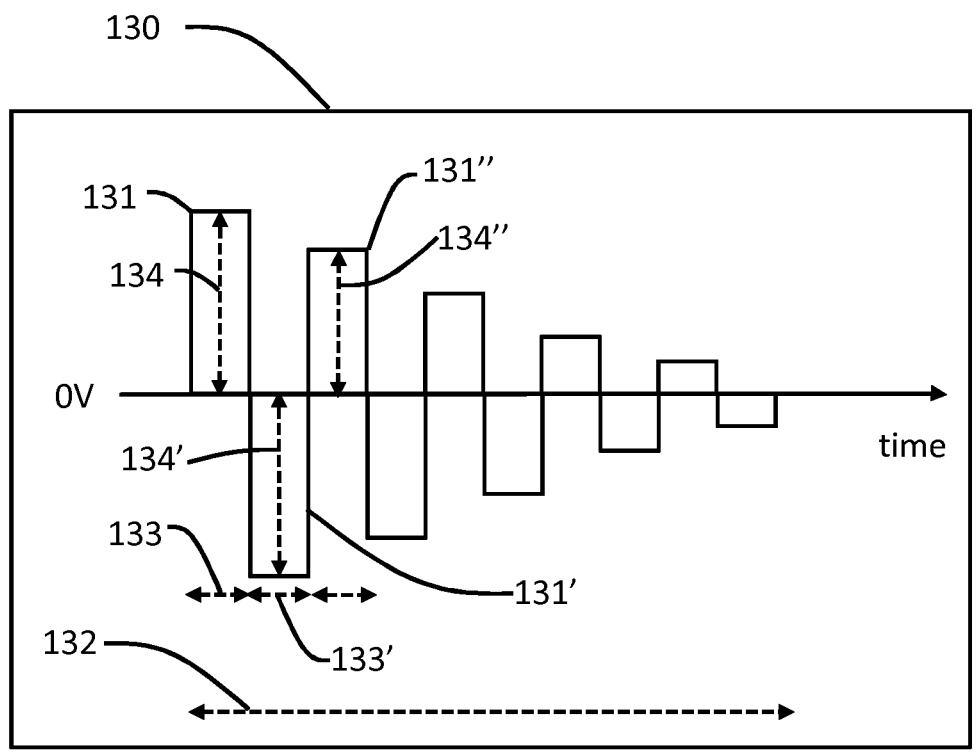
FIGS. 13B and 13C show alternating reset signals having a decaying amplitude.
Figure 13C:
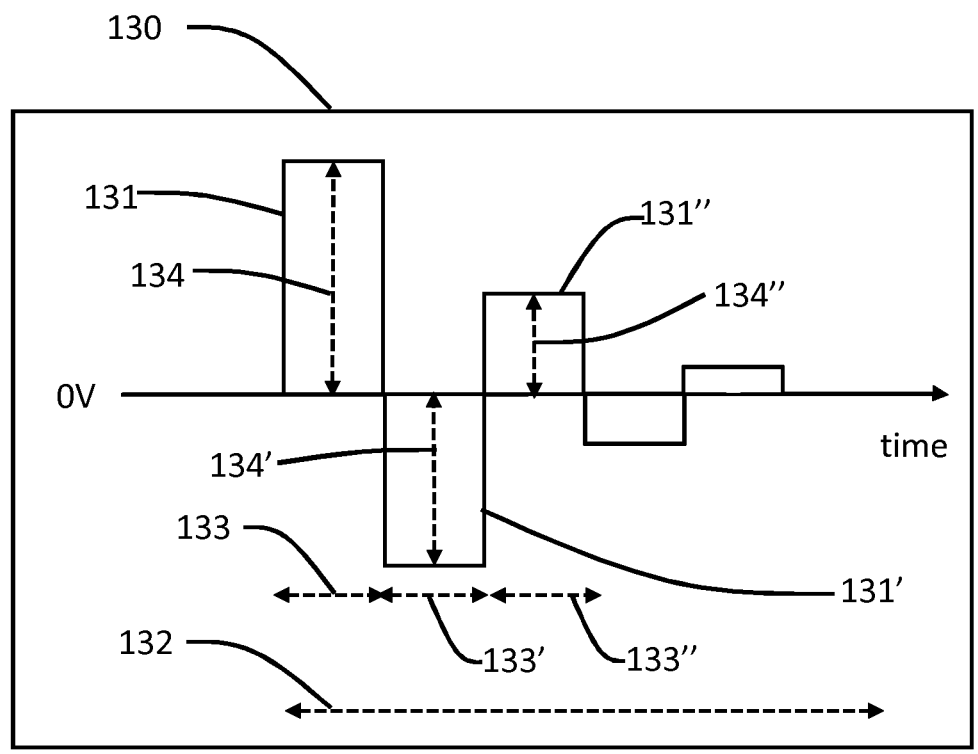
Figure 14:
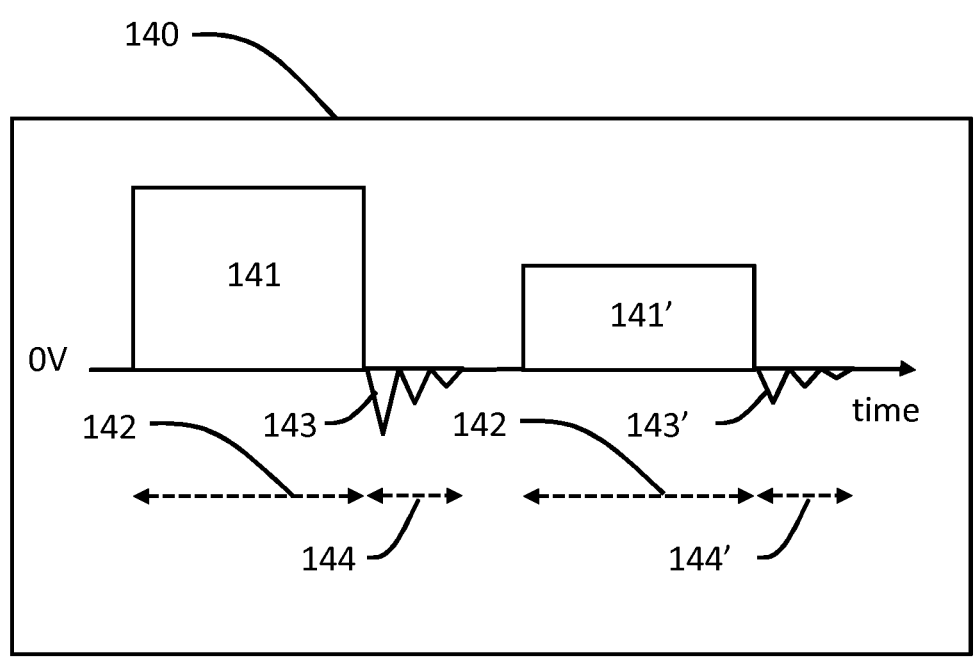
FIG. 14 shows an exemplifying control signal according to the invention.

In one subset, the reset signal can be a pulsating signal with all of the plurality of pulses having the same polarity (unipolar pulsating reset signal). FIG. 12A to 12B show examples with reset signals 120 with a reset signal duration 121 and comprising three successive triangularly shaped reset signal pulses 122, 122' and 122" each with a corresponding reset signal pulse period 123, 123' and 123" and reset signal amplitude 124, 124' and 124". In FIG. 12A the reset signal pulse periods and amplitudes are the same. In FIG. 12B the amplitudes 124, 124' and 124" reduces for every next reset signal pulse. There may thus be a decay of reset signal pulse amplitude. For example $2^{nd}$ pulse amplitude can half of the $1^{st}$ pulse amplitude, and so on. Other pulse amplitude variations such as linear decay, exponential decay etc, or even random variation can be used as will be explained below In another subset of multipulse reset signals, the rest signal includes a plurality of reset signal pulses wherein at least two of the plurality of reset signal pulses have opposite polarity. The number of different polarity reset signal pulses and their order in the reset signal can be random, but preferably is not. The reset signal may thus be an alternating signal. Preferably there are no delay times between reset signal pulses, but this need not be the case. Examples of alternating signals with triangular pulses and with square wave pulses are shown in FIGS. 13A, 13B and 13 C. The triangular, constant amplitude reset signal 130 of FIG. 13C includes three consecutive triangular reset signal pulses 131, 131' and 131" with corresponding periods 133, 133' and 133" within the reset signal duration of 132. The reset signals of FIGS. 13B and 13C have ten and six square wave reset signal pulses respectively within the reset signal duration 132. In each case only reset signal pulses 131, 131' and 131" with corresponding periods 133, 133' and 133" have been indicated with reference numerals for clarity. In both cases, the amplitude of the reset signal decays. While in FIG. 13A the amplitude of a reset signal pulse is reduced after every two subsequent pulses, in FIG. 13C this is done upon every next reset signal pulse.

For the multipulse reset signal, it is advantageous to have sets of bipolar pulses with uneven distribution of the different reset signal pulse polarities (positive and negative individual pulses within each set). Thus for example, it can be desirable to start with a negative (reset) voltage after a drive signal ending with a positive part and to end with a negative voltage before continuing to the next actuation with a positive drive signal, or the other way around as indicated in FIG. 13C. The polarity of the first pulse can be chosen as described hereinabove depending on driving history. A reset signal with uneven numbers of positive and negative pulses not only provides multiple effective resets within the pulse itself, but it also causes a larger effective voltage× time product for one of the polarities, as opposed to a situation with an even number of pulses.

TABLE 1

Examples of multipulse reset signal polarity directions.

| Number of reset signal pulses in reset signal | Polarity distribution of reset signal pulses within the reset signal | | |
|---|---|---|---|
| 3 | −+− | | |
| 4 | −+−− | −−+− | |
| 5 | −+−−− | −−+−− | −−−+− |
| 5 | −+−+− | | |

"−" and "+" represent opposite reset signal pulse polarities.

Reset Signal Amplitude

As exemplified above, for single and multipulse reset signals the reset signal level or reset signal amplitude can be made to decay during the reset signal. While for a single reset pulse this just means that its level decreases over time (see above). For a multipulse reset signal including a series of successive reset signal pulses the amplitude reduces in some predefined manner. Especially a multipulse reset signal with amplitude decay configuration is expected to work more effectively for 'difficult to reset' types of EAP materials or structures. After all, some defects causing the offset effect may need a high field (pulse amplitude) for resetting while others require a lower field. Once high field reset with a first reset signal pulse has been achieved, lower field reset follows which may prevent disturbance of previously reset parts with the earlier pulse. The exact numerical details for decay of a reset signal pulse is dependent on the characteristics of the EAP structure driven. But schemes with linear, exponential or other types of decay may be used. For example, the amplitude of every next pulse may be smaller with a factor of ⅕, ⅓, ½ etc.

According to general electrostatic considerations, the electric field generated within an EAP structure upon providing a drive signal or reset signal is dependent on the signal level (voltage) and distance over which the voltage is provided. For the EAP structures this means that electric field and voltage are related through a thickness of layers of the EAP structure.

Using driving pulses of an opposite polarity whereby the product of (voltage×time) for the reset pulse is smaller than for the actuation voltage can achieve benefits for both drift and actuation amplitude. In these examples, the product of (voltage×time) for the reset pulse is preferably more than a factor 10 smaller than for the actuation voltage.

As based on experiences with the above described exemplifying actuator, already good effect can be achieved with the following parameter ranges for reset signals.

A reset signal pulse amplitude electric field between 10 Volt/micron-300 Volt/micron, where low fields will advantageously not lead to actuator deformation, while high fields will do so as explained with ref. to FIG. 8). Hence, a preferred range of Field is between 10 Volt/micron-100 Volt/micron or even between 10 Volt/micron-50 Volt/micron. Preferably the reset signal level is a factor of at least 10 smaller than a drive signal level it is intended to compensate for.

Reset signal pulse duration greater than or equal to 0.01 seconds. Preferably, the duration is greater than or equal to 0.05 seconds. If there is only one pulse, then this duration represents the value for the reset signal duration.

Number of reset pulses in reset signal equal to a value of 1 to 10. Higher than one can be used but often is not needed.

In the above examples, the reset signals comprise or consist of reset pulses of specific type, shape or waveform, e.g triangular, square wave etc. However, other shapes or waveforms can be used in the examples without loss of effect of the invention and such waveforms include but are not limited to sinusoidal, square wave, other, or combinations.

In all of the multipulse reset signals, there may be a time delay between successive reset signal pulses, but this need not be the case.

In all of the multipulse or variable reset signals, rest signal pulse periods or variation periods or times can be different or the same. Different such periods may have advantages if defects causing the offset effect have different relaxation timescales. While kept constant in this example during the reset signal, the reset signal pulse period may change during (it may for example reduce or increase for every next reset signal pulse) within a reset signal duration 121. Duration or period can become smaller for higher rest signal level or pulse amplitude.

In all of the mulitpulse signal examples above, there were three signal reset pulses. However, other numbers of pulses may be used and these may differ from one reset signal to another. Thus there may be reset signals having a number of pulses greater than: 2, 3, 4, 5, 10, 100, or 1000. The number of pulses may depend on their period and the total reset signal duration. Often less than 10 pulses will work. A lower number of pulses can limit the duration of a reset signal and since the reset signal can distract from the actual use time of the device often its limitation to a value as small as possible is advantageous.

There may be used high frequency perturbations superimposed on the nominal reset pulse shape in order to improve dislodging effects/remove internal frictions in the EAP structure.

As described above many combinations of parameters of the reset signals can be chosen to achieve a desired compensation of the offset effect. For example, of a reset signal or any of its reset signal pulses, the following parameters can be set individually, or in combination: the type shape or waveform (e.g. square wave, triangular, sinusoidal or other rest pulse and/or e.g. variable, pulsating, alternating reset signal), number of pulses, duration or period, polarity, level or amplitude, a decay or increase of level or amplitude, a frequency. One or more sets of these parameters may give better or best offset effect compensation for a particular actuator, i.e. the set of parameters will depend on the design of EAP structure and materials used as well as actuations (to be achieved with associated drive signals) required. Hence, the reset signal parameters can be optimised.

This optimisation can be done using testing and calibration; beforehand or using active feedback. For example a set of required drive signals for a desired actuation can be provided to the actuator without a reset signal in order to estimate the offset effects of the actuator. Then, reset signals with different characteristics can be combined with the drive signals their effect on reduction of the offset effects observed. Reset signals can be then be chosen based on these results and used during actual use of the device.

A calibration device can be used for the testing or feedback. Such device can be an electronic device including a signal generator for providing drive signals and reset signals according to the invention and a means for observing or measuring the actuation invoked with the signals. This means can e.g. be a camera for observing the actuation, or a laser beam reflecting off of the actuator while the beam deflection is measured, or an electrical feedback measuring actuation dependent electrical characteristics of the EAP structure or material (e.g capacitance). Any other actuation feedback providing device can be used also.

With the calibration method and device a lookup table can be constructed having stored reset signal parameter data correlating with drive signal data or even actuation data (as these will require some drive signal). Also incremental parameters of reset signals correlating incremental drive signals or actuations can be used. Thus, e.g. if a drive signal amplitude is increased with an incremental value, then the reset signal needs to be increased, and/or elongated.

The calibration and the device can be implemented as a feedback and a feedback device. This gives freedom of choice for offset effect compensation as dependent on a driving signal chosen at some point in time for a non-predictable actuation, an accurate feedback based reset signal can be provided.

For both cases, a drive signal history tracking can be implemented. It can store or even determine (measure) data (parameters) of drive signals provided after a last reset signal based on which data reset signal parameters can be chosen (see herein above for the parameters. For example a signal integrator can be present.

Figure 15:
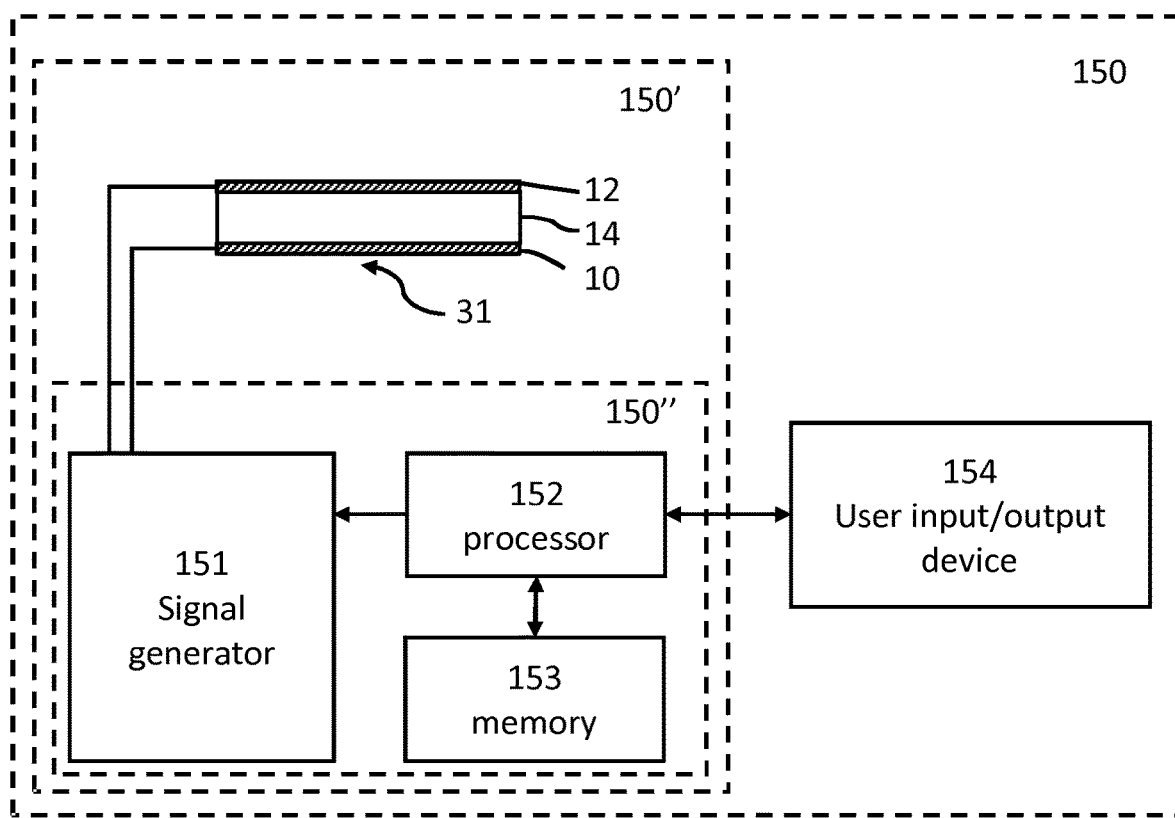
FIG. 15 shows devices according to the invention.

As an example of implementation of a device of the invention implementing the invention, FIG. 15 shows the device of FIG. 3 with a controller 150" including a signal generator 151, a processor 152 for controlling the signal generator and a data (e.g. electronic) memory 153 that can be accessed by the processor. The processor and memory can be semiconductor IC made using standard technology. The processor runs software for performing certain tasks to implement a method of the invention. In the memory is stored a lookup table as described herein before.

The software may enable giving a user opportunity to store reset signal data and drive signal data in the memory for creating the lookup table. But, alternatively, a lookup table can be predetermined and fixed at factory level. In the lookup table are stored, for example, data correlating drive signal amplitude and reset signal amplitude. Thus, e.g. for a larger drive signal a larger reset signal is needed.

The memory 153 of the device further stores other (in this case predetermined) reset signal data for defining that a reset signal is e.g 0.1 seconds long, a three, equally long, triangular pulse containing signal. The data further define that the signal is to have a polarity opposite to the last part of the drive signal preceding the reset signal. There is a decay of reset signal pulse amplitude such that every next amplitude is half is large as the previous one. In this example case these data are fixed, but the can be made user definable.

The device 151' can further include a user input device such as keyboard, mouse touchscreen connected to the processor with appropriate interfaces. Likewise the device can have an output device such as a display or audio device connected to the processor with appropriate interfaces. The input device and software can thus be suitable to have a user define the predetermined rest signal data. Alternatively, such data can be factory defined.

The device 150 can include the actuator including the EAP structure. This may be any kind of actuator according to the invention. Hence the device can be a catheter or other body lumen device, a personal care device etc. If detachable from the driver, different types of actuators can be driven with the driver according to need.

Figure 16:
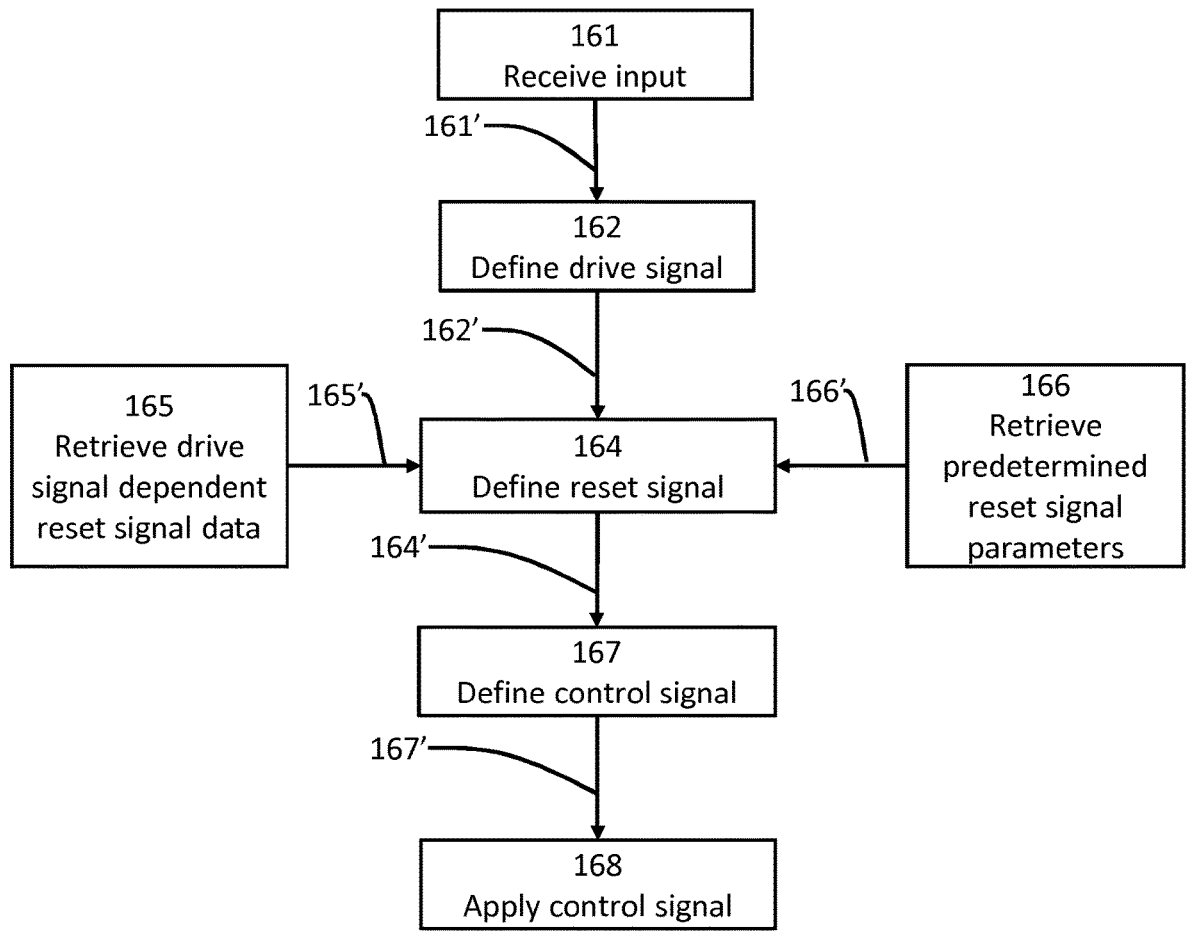
FIG. 16 shows a flow diagram for operation of a device according to the invention such as the one of FIG. 15.

FIG. 16 shows an exemplifying flow diagram 160 of a possible operating method of the actuator device 150. The device receives an input 161 of a user with the aim to have the device output a particular actuation (displacement or force pressure etc.) invoked by application 168 of a control signal 167' to the EAP structure. Based on the input 161', a drive signal 162' for achieving a particular actuation is defined in step 162. Based on the drive signal 162', drive signal dependent data 165' for the reset signal (in this case e.g. reset signal amplitude and polarity opposite to that of the drive signal) is retrieved in step 165, predetermined reset signal data 166' (e.g signal shape duration and number of pulses) are retrieved in step 166 and combined in step 164 to form a reset signal 164'. In step 167, the drive signal 162' and the reset signal 164' are combined to form a control signal 167'. The control signal is subsequently applied to the EAP structure in step 168 to have the actuator device output the desired actuation.

This invention relates in particular to actuation of EAP actuators comprising EAP materials as part of an EAP structure. This is a material that can make the EAP structure deform upon providing an electrical signal to the EAP structure. As such the EAP material can be a mixture (homogeneous or heterogeneous) comprising or consisting of one or more matrix materials with one or more EAPs. This can for example be an EAP dispersion in a further polymer matrix material. The further polymer matrix material can be a network polymer that allows deformation invoked by the EAP mixed in or dispersed within the matrix network. The EAP material can be dispersed in it. Elastic materials are examples of such networks. Preferably the amount of EAP in such composite EAP materials is chosen from the group consisting of >50 weight or mole percent, >75 weight or mole percent or >90 weight or mole percent. EAP materials can also comprise polymers that contain in their molecules parts of EAPs (or EAP active groups) and parts of inactive other polymers. Many electroactive polymers can be used a number of which will be described below.

Within the subclass of field driven EAPs, a first notable subclass of field driven EAPs are Piezoelectric and Electrostrictive polymers. While the electromechanical performance of traditional piezoelectric polymers is limited, a breakthrough in improving this performance has led to PVDF relaxor polymers, which show spontaneous electric polarization (field driven alignment). These materials can be pre-strained for improved performance in the strained direction (pre-strain leads to better molecular alignment).

Another subclass of field driven EAPs is that of Dielectric Elastomers. A thin film of this material may be sandwiched between compliant electrodes, forming a capacitor such as a parallel plate capacitor. In the case of dielectric elastomers, the Maxwell stress induced by the applied electric field results in a stress on the film, causing it to contract in thickness and expand in area. Strain performance is typically enlarged by pre-straining the elastomer (requiring a frame to hold the pre-strain). Strains can be considerable (10-300%). For this class of materials, electrodes are preferably mechanically attached either directly or with intermediate material layers to the EAP material.

For the first subclass of materials normally thin film metal electrodes are used since strains usually are in the moderate regime (1-5%), also other types of electrodes, such as e.g. conducting polymers, carbon black based oils, gels or elastomers, etc. can also be used. For the second class of materials typically type of electrode materials is constrained by the high strains. Thus for dielectric materials with low and moderate strains, metal electrodes and conducting polymer electrodes can be considered, for the high-strain regime, carbon black based oils, gels or elastomers are typically used.

A first notable subclass of ionic EAPs is Ionic Polymer Metal Composites (IPMCs). IPMCs consist of a solvent swollen ion-exchange polymer membrane laminated between two thin metal or carbon based electrodes and requires the use of an electrolyte. Typical electrode materials are Pt, Gd, CNTs, CPs, Pd. Typical electrolytes are Li+ and Na+ water-based solutions. When a field is applied, cations typically travel to the cathode side together with water. This leads to reorganization of hydrophilic clusters and to polymer expansion. Strain in the cathode area leads to stress in rest of the polymer matrix resulting in bending towards the anode. Reversing the applied voltage inverts bending. Well known polymer membranes are Nafion® and Flemion®.

Another notable subclass of Ionic polymers is Conjugated/conducting polymers. A conjugated polymer actuator typically consists of an electrolyte sandwiched by two layers of the conjugated polymer. The electrolyte is used to change oxidation state. When a potential is applied to the polymer through the electrolyte, electrons are added to or removed from the polymer, driving oxidation and reduction. Reduction results in contraction, oxidation in expansion.

In some cases, thin film electrodes are added when the polymer itself lacks sufficient conductivity (dimension-wise). The electrolyte can be a liquid, a gel or a solid material (i.e. complex of high molecular weight polymers and metal salts). Most common conjugated polymers are polypyrolle (PPy), Polyaniline (PANi) and polythiophene (PTh).

An actuator may also be formed of carbon nanotubes (CNTs), suspended in an electrolyte. The electrolyte forms a double layer with the nanotubes, allowing injection of charges. This double-layer charge injection is considered as the primary mechanism in CNT actuators. The CNT acts as an electrode capacitor with charge injected into the CNT, which is then balanced by an electrical double-layer formed by movement of electrolytes to the CNT surface. Changing the charge on the carbon atoms results in changes of C—C bond length. As a result, expansion and contraction of single CNT can be observed.

In relation to the above materials and with more detail, electro-active polymers thus can include, but are not limited to, the sub-classes: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to: Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The sub-class dielectric elastomers includes, but is not limited to: acrylates, polyurethanes, silicones.

The sub-class conjugated polymers includes, but is not limited to:

polypyrrole, poly-3,4-ethylenedioxythiophene, poly(p-phenylene sulfide), polyanilines.

Ionic devices may be based on ionic polymer-metal composites (IPMCs) or conjugated polymers. An ionic polymer-metal composite (IPMC) is a synthetic composite nanomaterial that displays artificial muscle behavior under an applied voltage or electric field.

In more detail, IPMCs are composed of an ionic polymer like Nafion or Flemion whose surfaces are chemically plated or physically coated with conductors such as platinum or gold, or carbon-based electrodes. Under an applied voltage, ion migration and redistribution due to the imposed voltage across a strip of IPMCs result in a bending deformation. The polymer is a solvent swollen ion-exchange polymer membrane. The field causes cations travel to cathode side together with water. This leads to reorganization of hydrophilic clusters and to polymer expansion. Strain in the cathode area leads to stress in rest of the polymer matrix resulting in bending towards the anode. Reversing the applied voltage inverts the bending.

The electrodes of the EAP structure can have many configurations each with specific advantages and effects.

If the plated electrodes are arranged in a non-symmetric configuration, the imposed signals (e.g. voltage) can induce all kinds of deformations such as twisting, rolling, torsioning, turning, and non-symmetric bending deformation of the EAP structure.

In all of these examples, additional passive layers may be provided for influencing the electrical and/or mechanical behavior of the EAP material layer in response to an applied electric field or current.

The EAP material layer of each unit may be sandwiched between electrodes. Alternatively, electrodes can be on a same side of the EAP material. In either case, electrodes can be physically attached to the EAP material either directly without any (passive) layers in between, or indirectly with additional (passive) layers in between. But this need not always be the case. For relaxor or permanent piezoelectric or ferroelectric EAPs, direct contact is not necessary. In the latter case electrodes in the vicinity of the EAPs suffices as long as the electrodes can provide an electric field to the EAPs, the Electroactive polymer structure will have its actuation function. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

The materials for the different layers can be selected for example taking account of the elastic moduli (Young's moduli) of the different layers. Thus, too stiff layers will oppose the actuation forces caused with the EAP materials. Hence preferably additional layers are less stiff than the EAP material layers or parts themselves.

Additional layers to those discussed above may be used to adapt the electrical or mechanical behavior of the device, such as additional polymer layers for adhesion.

The device may be used as a single actuator, or else there may be a line or array of the devices, for example to provide control of a 2D or 3D contour.

The invention can be applied in many EAP applications, including examples where a passive matrix array of actuators is of interest, in particular as a result of the threshold function described above for some actuator examples.

In many applications the main function of the product relies on the (local) manipulation of human tissue, or the actuation of tissue contacting interfaces. In such applications EAP actuators provide unique benefits mainly because of the small form factor, the flexibility and the high energy density. Hence EAP's can be easily integrated in soft, 3D-shaped and/or miniature products and interfaces. Examples of such applications are:

Skin cosmetic treatments such as skin actuation devices in the form of EAP-based skin patches which apply a constant or cyclic stretch to the skin in order to tension the skin or to reduce wrinkles;

Respiratory devices with a patient interface mask which has an EAP-based active cushion or seal, to provide an alternating normal pressure to the skin which reduces or prevents facial red marks;

Electric shavers with an adaptive shaving head. The height of the skin contacting surfaces can be adjusted using EAP actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of EAP transducers which is integrated in or near the user interface;

Catheters with a steerable tip to enable easy navigation in tortuous blood vessels.

Another category of relevant application which benefits from EAP actuators relates to the modification of light. Optical elements such as lenses, reflective surfaces, gratings etc. can be made adaptive by shape or position adaptation using EAP actuators. Here the benefits of EAPs are for example the lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

In summary, the invention involves providing a reset signal before and or after one or more actuation signals to an electroactive polymer structure of an actuator. The reset signal can cause relaxation of defects such as e.g. trapped charge, dipoles and/or others in the EAP or EAP structure so that upon a subsequent activation using a drive signal, the initial actuation state is defined to be more constant than without use of the reset signal. Hence the actuation output of a device employing the invention is more reproducible. The invention is applicable to actuator devices that have an electroactive polymer structure including an EAP material, where the structure is capable of providing a mechanical actuation upon subjection of at least part of the EAP material to an electrical drive signal.

The invention claimed is:

1. A method of operating a device, the device including an electroactive polymer actuator comprising:
   an electrode layout arranged to receive a control signal; and
   an electroactive polymer structure arranged to provide an actuation in response to the control signal;
the method comprising:
   generating the control signal, wherein the control signal comprises a drive signal,
wherein the drive signal is arranged to cause the actuation,
wherein the drive signal has a first polarity,
wherein the control signal comprises a reset signal with a second polarity,
wherein the second polarity is opposite to the first polarity, and
wherein the reset signal precedes and/or follows the drive signal; and
applying the control signal to the electrode layout,
wherein a peak magnitude of the reset signal is smaller than a peak magnitude of the drive signal.

2. The method as claimed in claim 1,
wherein the drive signal has a drive signal level and the reset signal has a reset signal level,
wherein the reset signal level is equal to, or less than a product of a level scaling factor and the drive signal level, and
wherein the level scaling factor is selected from a group consisting of: 0.5, 0.2, 0.1, 0.05, 0.02, and 0.01.

3. The method as claimed in claim 1, wherein the reset signal has a reset signal level such that an electric field across the electroactive polymer structure caused by the reset signal when applied to the electrode layout is between 10 volts per micron and 300 volts per micron.

4. The method as claimed in claim 1, wherein the reset signal is applied during a reset signal duration, which is between 0.01 seconds and 1 second.

5. The method as claimed in claim 1,
wherein the drive signal has a drive signal level and a drive signal duration and the reset signal has a reset signal level and a reset signal duration,
wherein an integral of the reset signal level over the reset signal duration is equal to, or smaller than a product of an integral scaling factor and an integral of the drive signal level over the drive signal duration, and
wherein the integral scaling factor is selected from a group consisting of: 0.5, 0.2, 0.1, 0.05, 0.02, and 0.01.

6. The method as claimed in claim 1,
wherein the drive signal has a drive signal duration,
wherein during the entire drive signal duration, or an end portion of the drive signal duration, the drive signal has the first polarity, and at least a portion of the reset signal has the second polarity, and
wherein the second polarity is opposite to the first polarity.

7. The method as claimed in claim 1, wherein the reset signal comprises a variable signal or an alternating signal.

8. The method as claimed in claim 1, wherein the reset signal comprises a plurality of reset signal pulses.

9. The method as claimed in claim 8, wherein the reset signal comprises an alternating signal having a constant or a varying period.

10. The method as claimed in claim 8, wherein each of the plurality of reset signal pulses has a maximum reset signal pulse level, and wherein an absolute value of the reset signal pulse level reduces for each next one of the plurality of reset signal pulses within the reset signal.

11. The method as claimed in claim 7,
wherein the reset signal comprises at least a first polarity and a second polarity, and
wherein the second polarity is opposite to the first polarity.

12. The method as claimed in claim 1, further comprising:
providing a lookup table, the lookup table comprising drive signal data and reset signal data,
wherein the drive signal data is arranged to define a plurality of drive signals,
wherein the reset signal data is arranged to define a plurality of reset signals, and
wherein each one of the drive signal data is related to one of the reset signal data;
upon definition of the drive signal, retrieving from the lookup table reset signal data for the reset signal based on one or more drive signal data within the lookup table; and
generating the drive signal and the reset signal of the control signal using the reset signal data and the retrieved reset signal data.

13. The method as claimed in claim 1, wherein the method further comprises:
determining an actuation history of the electroactive polymer actuator; and
generating the reset signal based on the actuation history.

14. The method as claimed in claim 1, wherein the reset signal follows and/or precedes every drive signal and/or follows and/or precedes a plurality of drive signals.

15. A computer program product comprising computer readable code stored on a computer readable storage medium, wherein the computer readable code, when executed on a computer, causes execution of the steps of the method as claimed in claim 1.

16. A device comprising:
an electroactive polymer actuator comprising:
an electrode layout arranged to receive a control signal from a controller circuit; and
an electroactive polymer structure arranged to provide an actuation in response to
the control signal,
wherein the controller circuit is arranged to control the electroactive polymer actuator,
wherein the controller circuit is arranged to generate the control signal,
wherein the control signal comprises a drive signal,
wherein the drive signal is arranged to cause the actuation,
wherein the drive signal has a first polarity,
wherein the control signal comprises a reset signal with a second polarity,
wherein the second polarity is opposite to the first polarity,
wherein the reset signal precedes and/or follows the drive signal,
wherein the controller circuit applies the control signal to the electrode layout, and
wherein a peak magnitude of the reset signal is smaller than a peak magnitude of the drive signal.

17. The device as claimed in claim 16, further comprising a processor circuit and a memory.

18. The device as claimed in claim 16, wherein the reset signal has a reset signal level such that an electric field across the electroactive polymer structure caused by the reset signal when applied to the electrode layout is between 10 volts per micron and 300 volts per micron.

19. The device as claimed in claim 16, wherein the reset signal is applied during a reset signal duration, which is between 0.01 seconds and 1 second.

20. The device claimed in claim 16,
wherein the reset signal comprises a plurality of reset signal pulses, and
wherein the reset signal comprises an alternating signal having a constant or a varying period.

* * * * *